(12) United States Patent
Heo

(10) Patent No.: US 11,716,877 B2
(45) Date of Patent: Aug. 1, 2023

(54) ORGANIC LIGHT-EMITTING DISPLAY DEVICE AND METHOD OF MANUFACTURING THE SAME

(71) Applicant: LG Display Co., Ltd., Seoul (KR)

(72) Inventor: Joon-Young Heo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 166 days.

(21) Appl. No.: 16/795,392

(22) Filed: Feb. 19, 2020

(65) Prior Publication Data
US 2020/0185480 A1    Jun. 11, 2020

Related U.S. Application Data

(62) Division of application No. 15/487,339, filed on Apr. 13, 2017, now Pat. No. 10,608,065.

(30) Foreign Application Priority Data

Apr. 29, 2016  (KR) .................. 10-2016-0053467
Dec. 30, 2016  (KR) .................. 10-2016-0184482

(51) Int. Cl.
| | |
|---|---|
| H10K 59/121 | (2023.01) |
| H10K 50/824 | (2023.01) |
| H10K 59/35  | (2023.01) |
| H10K 59/88  | (2023.01) |
| H10K 59/122 | (2023.01) |
| H10K 59/123 | (2023.01) |

(Continued)

(52) U.S. Cl.
CPC ....... *H10K 59/1213* (2023.02); *H10K 50/824* (2023.02); *H10K 59/122* (2023.02); *H10K 59/123* (2023.02); *H10K 59/124* (2023.02); *H10K 59/131* (2023.02); *H10K 59/1315* (2023.02); *H10K 59/35* (2023.02); *H10K 59/88* (2023.02); *H10K 71/00* (2023.02); *H10K 59/1201* (2023.02)

(58) Field of Classification Search
CPC .................................................. H01L 27/3279
See application file for complete search history.

(56) References Cited

U.S. PATENT DOCUMENTS

| | | |
|---|---|---|
| 8,115,376 B2 | 2/2012 | Fujioka et al. |
| 8,598,777 B2 | 12/2013 | Fujioka et al. |

(Continued)

FOREIGN PATENT DOCUMENTS

| | | |
|---|---|---|
| CN | 1917227 A | 2/2007 |
| CN | 102881713 A | 1/2013 |

(Continued)

OTHER PUBLICATIONS

China National Intellectual Property Administration, First Notification of Office Action, CN Patent Application No. 201710248843.7, dated Mar. 18, 2020, 21 pages.

(Continued)

*Primary Examiner* — Erik T. K. Peterson
(74) *Attorney, Agent, or Firm* — Fenwick & West LLP

(57) ABSTRACT

An organic light-emitting display device and a method of manufacturing the same are disclosed and these improve electrical connection between a cathode and an auxiliary electrode in order to reduce the resistance of the cathode that covers a plurality of sub-pixels, and may prevent lateral current leakage using the same structure.

9 Claims, 22 Drawing Sheets

(51) Int. Cl.
*H10K 59/124* (2023.01)
*H10K 59/131* (2023.01)
*H10K 71/00* (2023.01)
*H10K 59/12* (2023.01)

(56) References Cited

U.S. PATENT DOCUMENTS

| | | |
|---|---|---|
| 8,747,177 B2 | 6/2014 | Fujioka et al. |
| 9,806,279 B2 | 10/2017 | Im et al. |
| 9,859,345 B2 | 1/2018 | Lee et al. |
| 2005/0073243 A1 | 4/2005 | Yamazaki et al. |
| 2005/0074930 A1* | 4/2005 | Chen .............. H01L 29/4908 438/151 |
| 2005/0253508 A1 | 11/2005 | Okano |
| 2007/0090420 A1* | 4/2007 | Chu .............. G02F 1/136286 257/291 |
| 2009/0153046 A1* | 6/2009 | Hayashi .............. H01L 27/3279 313/505 |
| 2010/0244664 A1 | 9/2010 | Fujioka et al. |
| 2012/0086328 A1 | 4/2012 | Fujioka et al. |
| 2012/0205678 A1 | 8/2012 | Ikeda et al. |
| 2012/0208311 A1* | 8/2012 | Bang .............. H01L 51/5234 438/34 |
| 2013/0069853 A1* | 3/2013 | Choi .............. H01L 27/3276 345/80 |
| 2013/0210312 A1 | 8/2013 | Fujioka et al. |
| 2013/0270528 A1* | 10/2013 | Lee .............. H01L 27/3223 257/40 |
| 2014/0312323 A1 | 10/2014 | Park et al. |
| 2015/0090989 A1 | 4/2015 | Matsumoto et al. |
| 2015/0123084 A1* | 5/2015 | Kim .............. H01L 27/326 257/40 |
| 2015/0129844 A1* | 5/2015 | Kang .............. H01L 27/3262 257/40 |
| 2015/0137097 A1* | 5/2015 | Choi .............. H01L 27/3258 257/40 |
| 2015/0179719 A1* | 6/2015 | Nam .............. H01L 27/3246 257/40 |
| 2016/0013438 A1 | 1/2016 | Im et al. |
| 2016/0043341 A1* | 2/2016 | Heo .............. H01L 51/5228 257/40 |
| 2016/0079325 A1 | 3/2016 | Lee et al. |
| 2016/0149155 A1* | 5/2016 | Kim .............. H01L 27/3276 257/40 |
| 2016/0349899 A1 | 12/2016 | Hwang et al. |
| 2016/0351649 A1* | 12/2016 | Li .............. H01L 51/5228 |
| 2017/0062755 A1* | 3/2017 | Im .............. H01L 51/5228 |
| 2017/0125507 A1* | 5/2017 | Lee .............. H01L 51/5228 |
| 2017/0148865 A1* | 5/2017 | Cho .............. H01L 51/5228 |
| 2018/0006098 A1* | 1/2018 | Hong .............. H01L 27/3279 |

FOREIGN PATENT DOCUMENTS

| | | |
|---|---|---|
| CN | 103367390 A | 10/2013 |
| CN | 105261632 A | 1/2016 |
| CN | 105428387 A | 3/2016 |
| EP | 2966689 A1 | 1/2016 |
| EP | 2998997 A1 | 3/2016 |
| JP | 2007-073499 A | 3/2007 |
| JP | 2012-160388 A | 8/2012 |
| TW | 1479948 B | 4/2015 |

OTHER PUBLICATIONS

Extended European Search Report for European Patent Application No. EP 17164487.5, dated Sep. 27, 2017, 8 Pages.

Japanese Patent Office, Office Action, Japanese Application No. 2017-087745, dated Apr. 24, 2018, five pages (with concise explanation of relevance).

Office Action for Taiwan Patent Application No. TW 106114304, dated Sep. 25, 2017, 8 Pages.

United States Office Action, U.S. Appl. No. 15/487,339, dated May 17, 2019, 13 pages.

United States Office Action, U.S. Appl. No. 15/487,339, dated Jan. 7, 2019, nine pages.

United States Office Action, U.S. Appl. No. 15/487,339, dated Sep. 20, 2018, ten pages.

* cited by examiner

ORGANIC LIGHT-EMITTING DISPLAY DEVICE AND METHOD OF MANUFACTURING THE SAME

CROSS-REFERENCE TO RELATED APPLICATIONS

This application is a divisional application of U.S. patent application Ser. No. 15/487,339 filed on Apr. 13, 2017, which claims the benefit of Korean Patent Application No. 10-2016-0053467 filed on Apr. 29, 2016 and Korean Patent Application No. 10-2016-0184482 filed on Dec. 30, 2016, all of which are incorporated by reference herein.

BACKGROUND OF THE INVENTION

Field of the Invention

The present invention relates to an organic light-emitting display device, and more particularly to an organic light-emitting display device, which includes an auxiliary electrode in order to reduce the resistance of a cathode, which covers a plurality of sub-pixels, thereby being capable of improving electrical connection between the cathode and the auxiliary electrode and preventing lateral current leakage, and a method of manufacturing the same.

Discussion of the Related Art

With development of the information-oriented society, there is increased demand for display devices for displaying an image, and various display devices, such as, for example, liquid crystal display (LCD), plasma display panel (PDP), and organic light-emitting display or organic field-effect light-emitting display devices, have recently been used. In these various display devices, a display panel suitable for the same is included.

Among these, because an organic light-emitting display device is a self-illuminating device and does not need a separate light source unit, it is advantageous in that a design thereof is slim and flexible, and also in that it has good color purity.

Such an organic light-emitting display device includes an organic light-emitting diode (OLED) to realize light emission. The organic light-emitting diode includes two different electrodes with a light-emitting layer therebetween. When electrons generated in any one electrode and holes generated in the other electrode are introduced into the light-emitting layer, the introduced holes and electrons recombine to form excitons. Light emission is implemented through transition of the generated excitons from the excited state to the ground state.

One type of organic light-emitting display device, in which organic light-emitting diodes are individually included in a plurality of sub-pixels on a matrix defined in a substrate and driving thin-film transistors are included in the respective sub-pixels for the control of the organic light-emitting diodes, is referred to as an active-type organic light-emitting display device.

In the active-type organic light-emitting display device, the organic light-emitting diode includes first and second electrodes, which face each other, with an organic light-emitting layer interposed therebetween. The first electrode is patterned per sub-pixel, and the second electrode is integrally formed to cover the multiple sub-pixels.

Hereinafter, an organic light-emitting display device of related art will be described.

FIG. 1 is a graph illustrating measured variation of brightness from one side to the opposite side in an organic light-emitting display device of related art.

As illustrated in FIG. 1, it can be observed that the organic light-emitting display device of the related art has a rectangular planar shape and exhibits uneven brightness when variation of brightness is measured from one side to the opposite side such that the brightness is minimized at the center between one side and the opposite side and is gradually increased with decreasing distance to the edge (one side or the opposite side). This means that the brightness is gradually reduced with increasing distance from the edge or decreasing distance to the center.

After analyzing reasons for such uneven brightness, it has been noted that, in the organic light-emitting display device, the second electrode (e.g., an upper electrode) of the organic light-emitting diode, which is formed so as to cover the multiple sub-pixels, has large resistance due to the material properties thereof. More specifically, although a constant voltage or ground voltage is supplied to the edge of the second electrode, because the second electrode becomes farther away from a voltage supply unit with decreasing distance to the center, resistance of the second electrode is increased and voltage stability of the second electrode is deteriorated with increasing distance from the edge or decreasing distance to the center. Therefore, a difference in brightness between different areas occurs, as illustrated in FIG. 1, and a viewer may sensitively perceive such difference in brightness.

SUMMARY OF THE INVENTION

Accordingly, the present invention is directed to an organic light-emitting display device and a method of manufacturing the same that substantially obviate one or more problems due to limitations and disadvantages of the related art.

An object of the present invention is to provide an organic light-emitting display device, which includes an auxiliary electrode in order to reduce the resistance of a cathode, which covers a plurality of sub-pixels, thereby improving electrical connection between the cathode and the auxiliary electrode, and a method of manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an undercut structure is provided in an interlayer insulation stack, and an auxiliary electrode and a cathode are selectively connected to each other in the region defined by the undercut structure, whereby the brightness of a panel may be enhanced. In addition, when such a structure is applied to a non-emission area, lateral current leakage may be prevented.

According to one aspect of the present invention, an organic light-emitting display device includes a substrate including a display area, in which sub-pixels, each including an emission area and a non-emission area therearound, are arranged in a matrix, and an edge area surrounding the display area, an auxiliary electrode provided in the non-emission area of the substrate, an interlayer insulation stack having a first hole for exposing a portion of the auxiliary electrode, a first protruding pattern, of which at least one surface protrudes into the first hole so as to overlap a portion of the auxiliary electrode, on the interlayer insulation stack, and a cathode for coming into contact with the portion of the auxiliary electrode that overlaps the first protruding pattern.

The organic light-emitting display device may further include an organic light-emitting layer on an upper surface of a portion of the auxiliary electrode that does not overlap the first protruding pattern, and on the interlayer insulation stack in the emission area.

The cathode may be disposed on an upper surface of the portion of the auxiliary electrode that overlaps the first protruding pattern, and on the organic light-emitting layer disposed on the interlayer insulation stack in the emission area.

The organic light-emitting display device may further include a second hole formed in the interlayer insulation stack in the non-emission area excluding the first hole, and a second protruding pattern, of which at least one surface protrudes into a region of the second hole, on the interlayer insulation stack.

The first protruding pattern and the second protruding pattern may be in the same layer.

The organic light-emitting display device may further include an inorganic insulation film below the second hole, the inorganic insulation film having an etching rate different from that of a lower insulation film constituting the interlayer insulation stack.

The second hole may be located along one side of the emission area.

The second hole may be shaped to surround a periphery of the emission area.

At least one of the first protruding pattern and the second protruding pattern may be a bank having a first sub-hole above the auxiliary electrode, the first sub-hole being smaller than the first hole.

The interlayer insulation stack may include an inorganic insulation film and an organic insulation film, which are sequentially stacked from a side thereof close to the substrate.

The inorganic insulation film may have the first hole and the second hole, and the organic insulation film may have a first sub-hole and a second sub-hole, which are respectively smaller than the first hole and the second hole, and the first protruding pattern and the second protruding pattern are defined by the organic insulation film protruding into the first hole and the second hole.

The inorganic insulation film and the organic insulation film above the auxiliary electrode may have holes having the same diameter in an interface thereof.

The bank may have an opening in the emission area, and the organic light-emitting display device may include an organic light-emitting diode, which includes an anode, the organic light-emitting layer, and the cathode from a side thereof close to the substrate, in the emission area.

At least one of the first protruding pattern and the second protruding pattern may be an anode dummy pattern in the same layer as the anode.

The anode dummy pattern may be electrically connected to the auxiliary electrode through a contact hole in the interlayer insulation stack.

At least one of the first protruding pattern and the second protruding pattern may be an organic insulation film.

The auxiliary electrode may be located in the same layer as one electrode constituting a thin-film transistor in each sub-pixel.

The auxiliary electrode may be located in the same layer as a pad electrode in the edge area.

The interlayer insulation stack may have an open region for exposing a portion of a top of the pad electrode, and the open region may be defined by a hole in the inorganic insulation film.

In accordance with another aspect of the present invention, a method of manufacturing an organic light-emitting display device includes preparing a substrate including a display area, in which sub-pixels, each including an emission area and a non-emission area therearound, are arranged in a matrix, and an edge area surrounding the display area, providing an auxiliary electrode in the non-emission area of the substrate, providing an interlayer insulation stack having a first hole for exposing a portion of the auxiliary electrode, providing a first protruding pattern, at least one surface of which protrudes into the first hole so as to cover a portion of the auxiliary electrode, on the interlayer insulation stack, forming an organic light-emitting layer on an upper surface of the auxiliary electrode excluding the portion of the auxiliary electrode that is covered with the first protruding pattern, and forming a cathode for covering the organic light-emitting layer and coming into contact with the portion of the auxiliary electrode that is covered with the first protruding pattern.

The providing the interlayer insulation stack may include forming a second hole in the interlayer insulation stack in the non-emission area excluding the first hole.

The providing the first protruding pattern may include forming a second protruding pattern, of which at least one surface protrudes into a region of the second hole, on the interlayer insulation stack.

In accordance with a further aspect of the present invention, a method of manufacturing an organic light-emitting display device includes preparing a substrate including a display area, in which sub-pixels, each including an emission area and a non-emission area therearound, are arranged in a matrix, and an edge area surrounding the display area, providing an auxiliary electrode in the non-emission area of the substrate, a thin-film transistor in each sub-pixel, and a pad electrode in the edge area, forming a first contact hole for exposing one electrode of the thin-film transistor by sequentially forming an inorganic insulation film and an organic insulation film for covering the auxiliary electrode, the thin-film transistor, and the pad electrode, and thereafter, by commonly removing the inorganic insulation film and the organic insulation film, and removing the organic insulation film so as to form an organic insulation film hole, which corresponds to a top of the auxiliary electrode, forming an anode on the organic insulation film so as to be connected to the electrode of the thin-film transistor through the first contact hole, forming a bank for covering a portion of the anode, the bank having an opening in a region of the organic insulation film hole and in the emission area, and opening a top of the pad electrode, and simultaneously opening a top of the auxiliary electrode by selectively removing the inorganic insulation film using a photoresist pattern.

In the forming the bank, the bank may protrude into the organic insulation film hole so as to correspond to and overlap the auxiliary electrode, and the top of the pad electrode and the top of the auxiliary electrode may be protected by the inorganic insulation film.

The method may further include forming an organic light-emitting layer on the auxiliary electrode excluding a portion of the auxiliary electrode that overlaps the bank and the organic insulation film, and forming a cathode for covering the organic light-emitting layer and coming into contact with the portion of the auxiliary electrode that is covered with the bank.

The forming the anode may include forming an anode dummy pattern on the organic insulation film so as to protrude into the organic insulation film hole.

In the forming the first contact hole, a second contact hole may further be formed so as to be spaced apart from the first contact hole and to expose a portion of the auxiliary electrode, and in the forming the anode dummy pattern, the anode dummy pattern may be connected to the top of the auxiliary electrode through the second contact hole.

The photoresist pattern may protrude into an open region above the pad electrode to be formed and an open region above the auxiliary electrode.

In another embodiment, an organic light-emitting display device including a plurality of sub-pixels is provided, wherein at least one sub-pixel comprises a thin film transistor including at least an electrode; an organic light-emitting diode (OLED) disposed in an emission area of the sub-pixel and electrically coupled to the electrode of the thin film transistor; an auxiliary electrode in a non-emission area of the sub-pixel; a protective film of a first material and disposed on the thin film transistor and the auxiliary electrode, at least a part of the auxiliary electrode exposed by a first hole in the protective film; a protruding pattern layer of a second material different from the first material, the protruding pattern layer formed on the protective film in a first direction, the protruding pattern layer including a first protruding pattern protruding in a second direction intersecting the first direction toward the first hole in the protective film so as to overlap with at least a first portion of the exposed part of the auxiliary electrode, a first undercut structure including a first gap being formed between said first portion of the exposed part of the auxiliary electrode and the first protruding pattern; and a cathode of the OLED directly contacting at least a part of the exposed part of the auxiliary electrode under the first protruding pattern. The cathode is extended to the non-emission area of the sub-pixel to contact said at least the part of the exposed portion of the auxiliary electrode.

In some embodiments, the organic light-emitting display device further comprises an overcoat layer on the protective film; and a bank on the overcoat layer, wherein the bank is the protruding pattern layer. In other embodiments, the organic light-emitting display device further comprises an overcoat layer on the protective film; and a dummy anode layer of a same material as an anode of the OLED disposed on the overcoat layer, wherein the dummy anode layer is the protruding pattern layer. In still other embodiments, the organic light-emitting display device further comprises an overcoat layer on the protective film, wherein the overcoat layer is the protruding pattern layer.

In still another embodiment, an organic light-emitting display device including a plurality of sub-pixels is provided, wherein at least one sub-pixel comprises a thin film transistor including at least an electrode; an organic light-emitting diode (OLED) disposed in an emission area of the sub-pixel and electrically coupled to the electrode of the thin film transistor; an insulating layer covering at least a part of the thin film transistor; a protective film of a first material and disposed on the insulating layer, at least a part of the insulating layer exposed by a hole in the protective film; a protruding pattern layer of a second material different from the first material, the protruding pattern layer formed on the protective film in a first direction, the protruding pattern layer including a protruding pattern protruding in a second direction intersecting the first direction toward the hole in the protective film so as to overlap with at least a first portion of the exposed part of the insulating layer, an undercut structure including a gap being formed between said first portion of the exposed part of the insulating layer and the first protruding pattern, and an organic light emission layer of the OLED directly contacting at least a second portion of the exposed part of the insulating layer; and a cathode of the OLED disposed on the organic light emission layer and directly contacting at least the second portion of the exposed part of insulating layer under the first protruding pattern.

In some embodiments, the organic light-emitting display device further comprises an overcoat layer on the protective film; and a bank on the overcoat layer, wherein the bank is the protruding pattern layer. In other embodiments, the organic light-emitting display device further comprises an overcoat layer on the protective film; and a dummy anode layer of a same material as an anode of the OLED disposed on the overcoat layer, wherein the dummy anode layer is the protruding pattern layer. In still other embodiments, the organic light-emitting display device further comprises an overcoat layer on the protective film, wherein the overcoat layer is the protruding pattern layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE INVENTION

Figure 1:
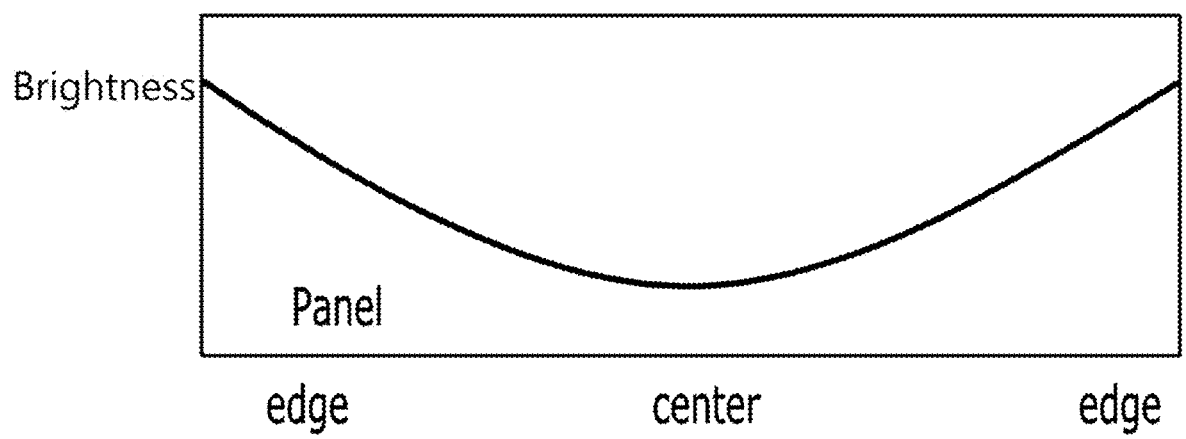
FIG. 1 is a graph illustrating measured variation of brightness from one side to the opposite side in an organic light-emitting display device of related art.

Hereinafter, embodiments in accordance with the present invention will be described in detail with reference to the accompanying drawings.

The embodiments described below are merely provided by way of example in order to allow the spirit of the present invention to be sufficiently transferred to those skilled in the art. Thus, the present invention is not limited to the embodiments described below and may be embodied in other forms. In addition, in the drawings, for example, sizes and thicknesses of constituent elements of a device may be exaggerated for convenience. The same reference numbers will be used throughout the specification to refer to the same or like constituent elements.

The advantages and features of the present invention and the way of attaining them will become apparent with reference to embodiments described below in detail in conjunction with the accompanying drawings. Embodiments, however, may be embodied in many different forms and should not be constructed as being limited to example embodiments set forth herein. Rather, these example embodiments are provided so that this disclosure will be through and complete and will fully convey the scope to those skilled in the art. The scope of the present invention should be defined by the claims. Wherever possible, the same reference numbers will be used throughout the drawings to refer to the same or like parts. In the drawings, the sizes of layers and regions and the relative sizes thereof may be exaggerated for clarity of description.

It will be understood that, when an element or a layer is referred to as being "on" another element or layer, it can be directly on the other element or intervening elements may also be present. In contrast, when an element is referred to as being "directly on" another component, there are no intervening components present.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures. For example, when an element illustrated in the drawing is inverted, an element, which is described as being disposed "below" or "beneath" another element, may be disposed above the other element. Thus, the exemplary term "below" may include both upward and downward directions.

The terminology used herein is for the purpose of describing particular example embodiments only and is not intended to be limiting. As used herein, the singular forms are intended to include the plural forms as well, unless the context clearly indicates otherwise. It will be further understood that the terms "comprises" and/or "comprising" "includes," and/or "including," when used in this specification, specify the presence of stated elements, steps, operations and/or components, but do not preclude the presence or addition of one or more other elements, steps, operations and/or components.

Figure 2:
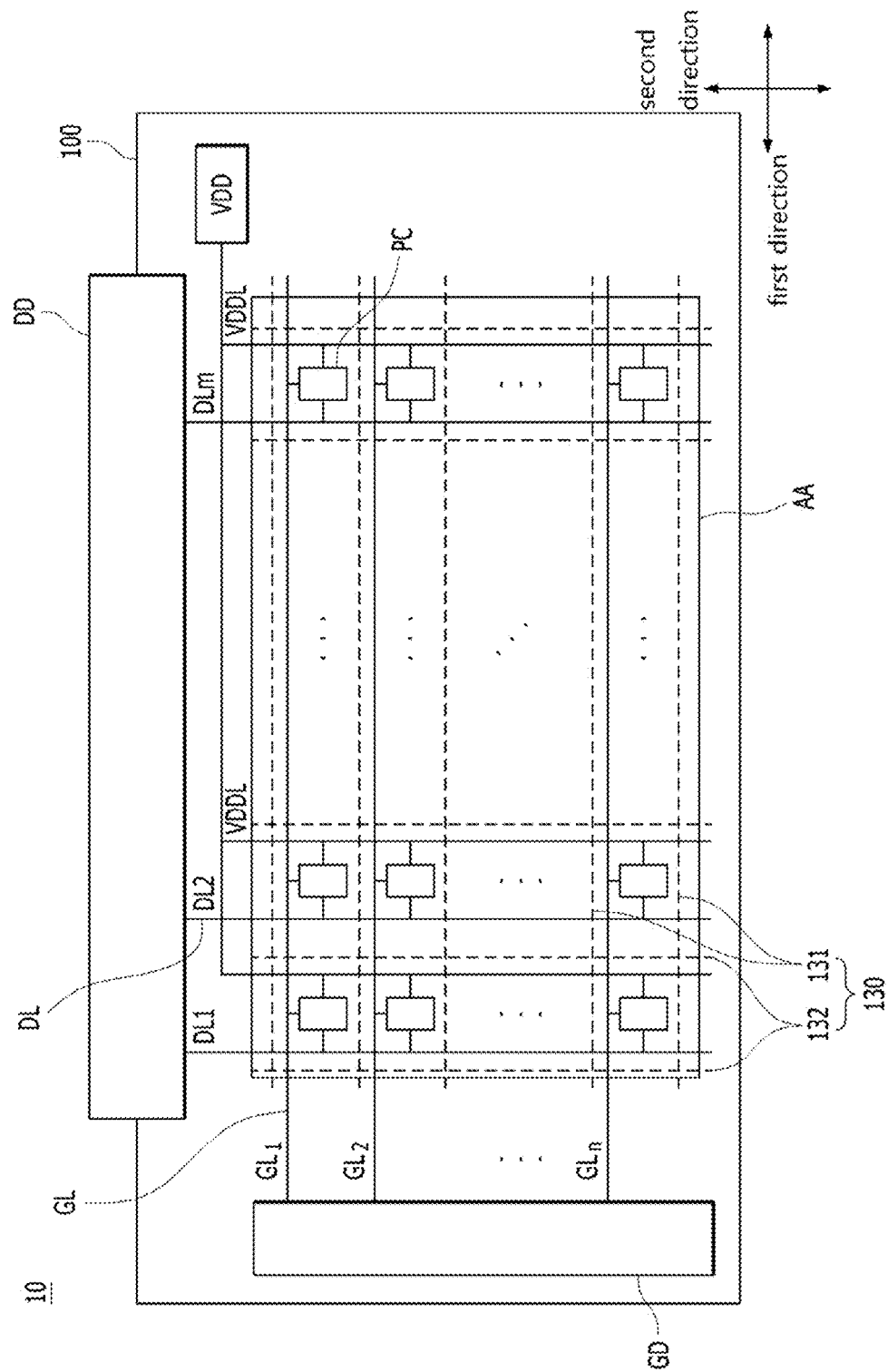
FIG. 2 is a schematic diagram illustrating an organic light-emitting display device of the present invention.
Figure 3:
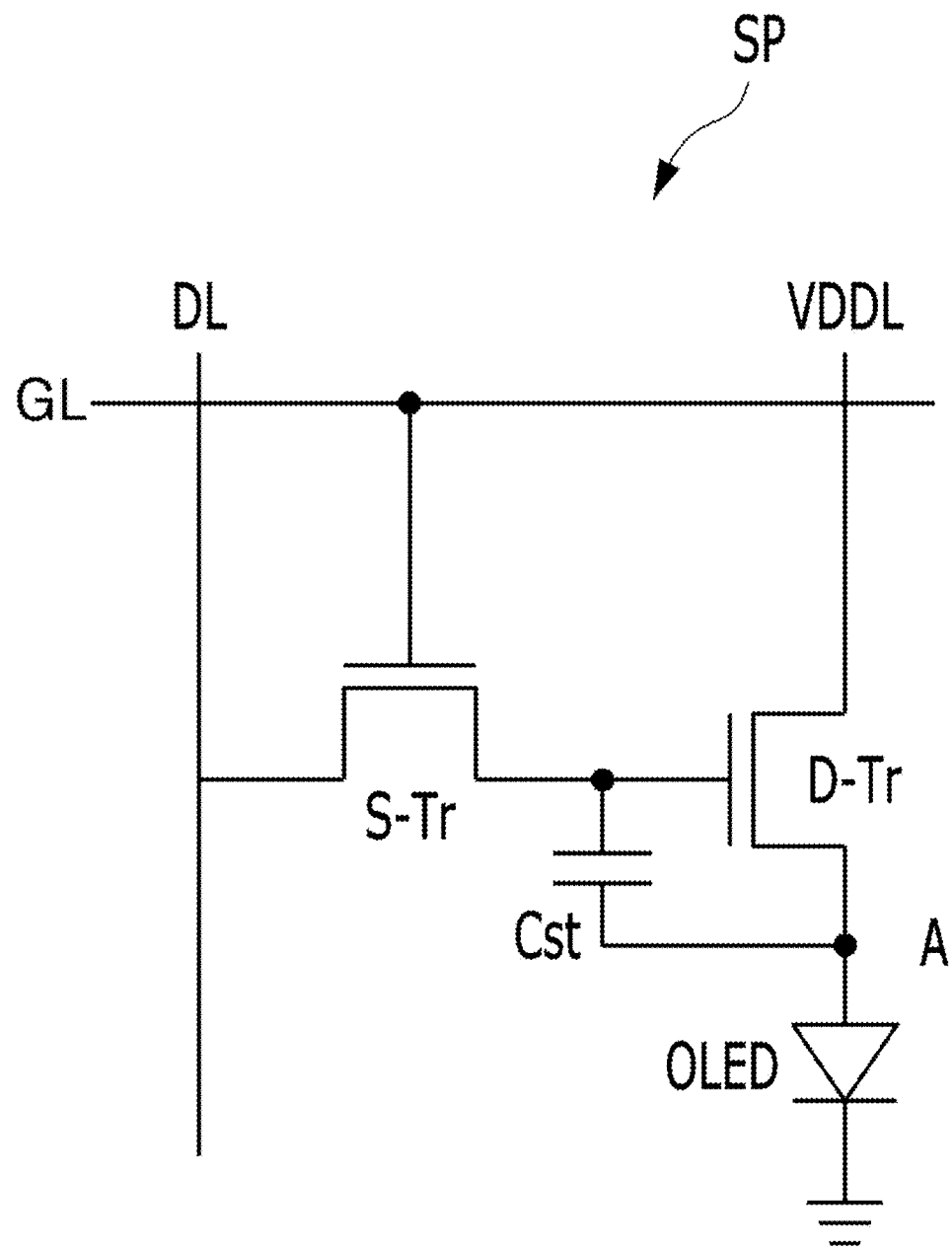
FIG. 3 is a circuit diagram of each sub-pixel illustrated in FIG. 2.

FIG. 2 is a schematic diagram illustrating an organic light-emitting display device of the present invention, and FIG. 3 is a circuit diagram of each sub-pixel illustrated in FIG. 2. In addition, FIG. 4 is a plan view illustrating each sub-pixel of FIG. 2.

First, in order to understand the configuration of the cross-sectional view that will be described below, space division and area definition with regard to the organic light-emitting display device of the present invention will be described with reference to FIGS. 2 to 4.

Figure 4:
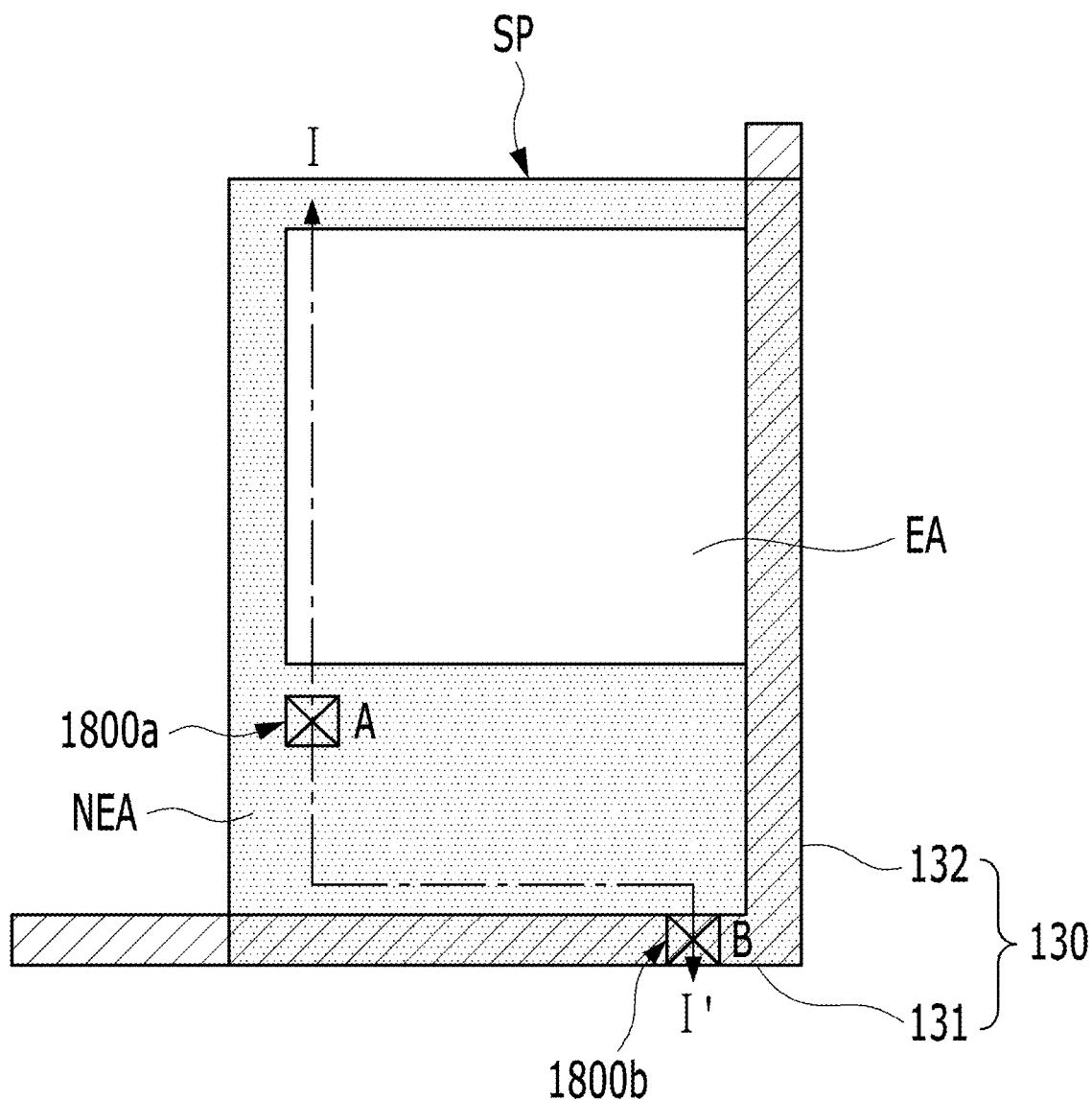
FIG. 4 is a plan view illustrating each sub-pixel of FIG. 2.

As illustrated in FIGS. 2 to 4, the organic light-emitting display device of the present invention, designated by reference numeral 10, includes a substrate 100 having a polygonal shape, preferably, a rectangular shape, and constituent elements on the substrate 100.

The substrate 100 is broadly divided into a central display area AA and an edge area therearound. In the display area AA, sub-pixels SP are arranged in a matrix. In the display area AA, each sub-pixel includes an emission area EA and a non-emission area NEA.

The sub-pixel SP is defined by a gate line GL and a data line DL, which cross each other. In addition, in the display area AA, a driving voltage line VDDL, to which a driving voltage is applied, is further provided in the same direction as the data line DL so as to drive a pixel circuit PC provided in each sub-pixel SP. The driving voltage line VDDL is connected to a driving thin-film transistor D-Tr, which constitutes the pixel circuit PC.

The pixel circuit PC connected to the aforementioned lines will now be described with reference to FIG. 3. The pixel circuit PC includes a switching thin-film transistor S-Tr, provided at the intersection of the gate line GL and the data line DL, the driving thin-film transistor D-Tr provided between the switching thin-film transistor S-Tr and the driving voltage line VDDL, an organic light-emitting diode (OLED) connected to the driving thin-film transistor D-Tr, and a storage capacitor Cst provided between a gate electrode and a drain electrode (or a source electrode) of the driving thin-film transistor D-Tr.

Here, the switching thin-film transistor S-Tr is formed in the area in which the gate line GL and the data line DL cross each other, and functions to select a corresponding sub-pixel. In addition, the driving thin-film transistor D-Tr functions to drive the organic light-emitting diode of the sub-pixel that is selected by the switching thin-film transistor S-Tr.

In addition, the edge area includes a gate driver GD to supply a scan signal to the gate line GL, and a data driver DD to supply a data signal to the data line DL. In addition, the driving voltage line VDDL may receive a driving voltage applied from a first power supply unit VDD, which is included in the edge area, or may receive a driving voltage through the data driver DD.

Here, the gate driver GD and the data driver DD or the first power supply unit VDD may be directly embedded in the edge area of the substrate 100 when the thin-film transistor is formed in the display area AA, or may be formed by attaching a film or any member having a printed circuit board to the edge area of the substrate 100. These circuit drivers are provided in the edge area around the display area in any case, and to this end, the display area AA is defined as being located inside the edge of the substrate 100.

The gate driver GD sequentially supplies a scan signal to a plurality of gate lines GL. For example, the gate driver GD is a control circuit, which supplies a scan signal to the gate lines GL in response to a control signal that is supplied from, for example, a timing controller (not illustrated).

In addition, the data driver DD supplies a data signal to selected data lines DL1 to DLm among a plurality of data lines DL in response to a control signal that is supplied from an external device, such as, for example, a timing controller (not illustrated). The data signal supplied to the data lines DL1 to DLm is supplied to selected sub-pixels SP in response to a scan signal whenever the scan signal is supplied to the gate lines GL1 to GLn. Thereby, the sub-pixels SP are charged with a voltage corresponding to the data signal, and emit light at a brightness corresponding to the voltage.

Meanwhile, the substrate 100 may be an insulative substrate formed of, for example, plastic, glass, or ceramic. When the substrate 100 is formed of plastic, it may be slim and flexible so as to be bendable. However, the material of the substrate 100 is not limited thereto, and the substrate 100 may be formed of a metal and includes an insulative buffer layer formed on the side on which wires and an array are formed.

In addition, a set of three or four sub-pixels SP, which emit, for example, light of different colors, may be defined as a pixel.

The sub-pixel SP means a unit in which a specific kind of color filter is formed, or in which, instead of a color filter, an organic light-emitting diode may emit a specific color of light. Although the colors defined with regard to the sub pixel SP may include red (R), green (G), and blue (B), and in some cases, may optionally include white W, the present invention is not limited thereto.

The organic light-emitting diode (OLED) is connected at a first node A to the driving thin-film transistor D-Tr, and includes an anode provided in each sub-pixel, a cathode opposite the anode, and an organic light-emitting layer between the anode and the cathode.

Meanwhile, the organic light-emitting display device 10 may be, for example, of a top-emission type, a bottom-emission type, or a dual-emission type. Here, a large-area display panel may cause a voltage drop of the cathode of the organic light-emitting diode in the process of forming the cathode throughout a display area regardless of the emission type thereof. Therefore, in the present invention, an auxiliary electrode or auxiliary electrode 130 is provided in the non-emission area to solve this problem, as illustrated in FIG. 4.

Here, the auxiliary electrode 130 is formed of a metal, is disposed in the same layer as the data line DL, and includes a contact (see reference numeral 1800b at a node B in FIG. 4) for the cathode. As such, the auxiliary electrode 130 having good conductivity is connected to the cathode in an individual sub-pixel or pixel, which may reduce the resistance of the cathode in the progress direction of the auxiliary electrode 130, thereby preventing a gradual worsening in the voltage drop of the cathode from the edge to the center.

In the illustrated example, although the auxiliary electrode 130 includes a first wire 131 in the direction of the gate line GL, and a second wire 132 in the direction of the data line DL, the present invention is not limited thereto, and the auxiliary electrode 130 may be arranged in only one of those directions.

Meanwhile, the auxiliary electrode 130, as described above, is formed in the same layer as the data line DL, i.e. in the same layer as one electrode that constitutes the thin-film transistor, and is patterned along with the data line DL or the electrode. The auxiliary electrode 130 may be formed in a single layer formed of copper (Cu), molybdenum (Mo), aluminum (Al), silver (Ag), or titanium (Ti), or multiple layers formed of combinations thereof. The auxiliary electrode 130 is connected to the cathode at the second node B, thereby functioning to reduce the resistance of the cathode.

Although the following description of embodiments will be based on a top-emission-type organic light-emitting display device, the embodiments of the present invention are not limited to the top-emission type, but may be applied to all structures of display devices for preventing a voltage drop of the cathode.

In all of the embodiments that will be described below, the organic light-emitting display device includes the substrate 100, which includes the display area AA, in which the sub-pixels SP, each sub-pixel including the emission area EA and the non-emission area NEA therearound, are arranged in a matrix, and the edge area surrounding the display area AA, the driving thin-film transistor D-Tr provided in each sub-pixel SP on the substrate 100, the organic light-emitting diode (OLED), which includes an anode 120 connected at the first node A to the driving thin-film transistor D-Tr so as to cover the emission area EA, a cathode 122 disposed throughout the display area AA, and an interlayer organic light-emitting layer 121 between the anode 120 and the cathode 122, the auxiliary electrode 130 connected to a portion of the bottom of the cathode 122 at the second node B in the non-emission area NEA, and an interlayer insulation stack 1800 disposed between the driving thin-film transistor D-Tr and the anode 120 and having a first contact hole 1800a and a first hole 1800b, which correspond to the first node A and the second node B for exposing a portion of the driving thin-film transistor D-Tr and a portion of the auxiliary electrode 130, respectively. In addition, with regard to the first hole 1800b in the interlayer insulation stack 1800, a protruding pattern is provided inside the first hole 1800b, thus having an undercut shape. Selective connection between the auxiliary electrode 130 and the cathode 122 may be implemented below the resulting undercut structure.

Hereinafter, organic light-emitting display devices according to several embodiments of the present invention and a manufacturing method thereof will be described in detail with reference to the accompanying cross-sectional views.

First Embodiment

Figure 5:
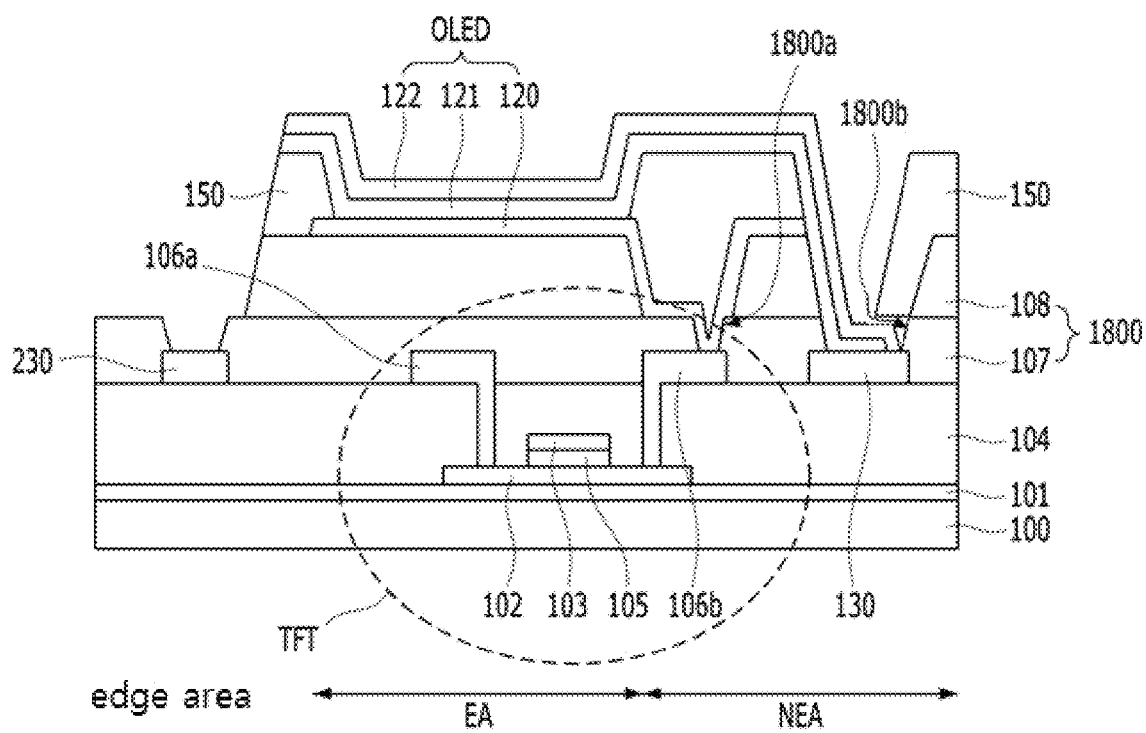
FIG. 5 is a cross-sectional view illustrating an organic light-emitting display device according to a first embodiment of the present invention.

FIG. 5 is a cross-sectional view illustrating an organic light-emitting display device according to a first embodiment of the present invention.

As illustrated in FIG. 5, the organic light-emitting display device of the present invention includes the substrate 100, which includes the display area AA in which the sub-pixels SP, each including the emission area EA and the non-emission area NEA therearound, are arranged in a matrix, and the edge area surrounding the display area AA, the auxiliary electrode 130: 131 and 132 (as shown in FIG. 4) provided in the non-emission area NEA of the substrate 100, and the interlayer insulation stack 1800, which has the first hole 1800b therein for exposing the auxiliary electrode 130. The first hole 1800b may entirely expose an upper surface of the auxiliary electrode 130 or partially expose the upper surface of the auxiliary electrode 130.

In addition, on the surface of the interlayer insulation stack 1800 in a first direction (e.g., vertical direction), a bank 150 is disposed. The bank 150 is shaped so that at least one surface thereof laterally protrudes into the first hole 1800b in a second direction (e.g., horizontal direction) intersecting the first direction so as to overlap a portion of the auxiliary electrode 130 in the region that is opened by the first hole 1800b with a gap formed between the protruded portion of the bank 150 and the auxiliary electrode 130. Here, the bank 150 may be disposed only on the top of the interlayer insulation stack 1800, or may be disposed, as illustrated, on the top and a portion of the sidewall of the interlayer insulation stack 1800 so as to achieve a greater overlap area with the auxiliary electrode 130 than the interlayer insulation stack 1800. The bank 150 may be vertically spaced from a bottom of the first hole 1800b.

Here, in the open region of the first hole 1800b that does not overlap the bank 150, the organic light-emitting layer 121 is disposed on the upper surface of the auxiliary electrode 130, and in turn the cathode 122 is disposed to cover the organic light-emitting layer 121.

In the open region of the first hole 1800b that overlaps and is covered by the bank 150, no organic light-emitting layer 121 is disposed on a portion of the auxiliary electrode 130 because an organic light-emitting material tends to be deposited straight from the top in a vertical direction. Thus, the cathode 122 may enter the region in which no organic light-emitting layer 121 is disposed and in which the bank 150 and the auxiliary electrode 130 overlap each other with a physical gap therebetween, whereby the cathode 122 may come into contact with the auxiliary electrode 130 and the cathode 122 can directly contact the auxiliary electrode 130.

In the organic light-emitting display device of the present invention, a protruding pattern, which is disposed above the auxiliary electrode 130, thus forming an undercut structure, may be an overcoat layer 108 or an anode material layer (referring to FIGS. 10-11D), in addition to the above-described bank 150, and other concrete examples will be described below. Meanwhile, the term "undercut" described in the present invention means that more of a lower pattern is removed than an upper pattern. Thus, in the undercut structure, the lower pattern is removed over a wider area at the interface of the upper pattern and the lower pattern.

Specifically, in the case where the bank 150 is disposed on a protective film 107 so as to form a protruding pattern above the auxiliary electrode 130, the organic light-emitting layer 121, which is deposited without an exposure mask, may not accumulate well below a region of the protruding bank 150, and thus the thickness thereof may be uneven because it strongly tends to be straightly deposited in a vertical direction. Thus, although the organic light-emitting layer 121 may be evenly formed on the upper surface of the portion of the auxiliary electrode 130 and on the interlayer insulation stack 1800 in the emission area EA that does not overlap the bank 150, the organic light-emitting layer 121 may substantially not be disposed in the region in which the bank 150 and the auxiliary electrode 130 overlap each other with a gap therebetween. In contrast, the cathode 122, which is deposited by sputtering, may be deposited on the auxiliary electrode 130 even below the protruding bank 150, because metal particles are deposited via diffused reflection to thereby move along the undercut region in a horizontal direction. That is, the cathode 122 is disposed on the upper surface of the portion of the auxiliary electrode 130 that overlaps the bank 150, which protrudes into the first hole 1800b, and on the organic light-emitting layer 121 that is disposed on the interlayer insulation stack 1800 in the emission area EA. Accordingly, the cathode 122, which is an upper electrode of the organic light-emitting diode, comes into contact with a portion of the auxiliary electrode 130 below the protruding bank 150 in the undercut structure. With this contact with the auxiliary electrode 130, the resistance of the cathode 122 may be reduced, and a voltage drop in the cathode 122 may be prevented.

Meanwhile, the interlayer insulation stack 1800 may be a stack in which the protective film 107, which is an inorganic insulation film, and the overcoat layer 108, which is an organic insulation film, are stacked in that sequence from the side close to the substrate 100. For example, the protective film 107 may be an oxide film, a nitride film, or an oxide nitride film, and may be deposited in one layer or in multiple layers of the aforementioned films. The overcoat layer 108 may be formed of an organic material to the thickness required for the flattening of convex and concave portions on the surface thereof, and may be formed of an organic film, such as, for example, a photo acryl film.

In the organic light-emitting display device according to the first embodiment of the present invention, the first hole 1800b may be implemented as multiple holes, which have the same diameter in the interface of the protective film 107 and the overcoat layer 108 above the auxiliary electrode 130 at each sub-pixel. In the first embodiment described above, the interlayer insulation stack 1800 is configured such that the protective film 107 and the overcoat layer 108 thereof include no protruding pattern, and the bank 150 disposed on the overcoat layer 108 functions as a protruding pattern.

In addition, the interlayer insulation stack 1800 has an open region for exposing a portion of a top of a pad electrode 230. The open region may be defined by a hole in the protective film 107, which is an inorganic insulation film.

Here, the bank 150 has an opening in the emission area EA, and in the emission area EA, includes the organic light-emitting diode, which includes the anode 120, the organic light-emitting layer 121, and the cathode 122, which are disposed in that sequence from the side close to the substrate 100.

In the configuration illustrated in FIG. 5, although the bank 150 is illustrated as protruding from only one side thereof into the first hole 1800b in the interlayer insulation stack 1800 (protruding from the right side thereof into the first hole 1800b in the drawing), the present invention is not limited thereto, and a plurality of portions of the bank 150 may protrude symmetrically or asymmetrically into the first hole 1800b. In this case, all of the protruding portions may prevent the organic light-emitting layer 121 from being deposited, but may allow deposition of the cathode 122.

In addition, the bank 150 is not formed immediately after formation of the interlayer insulation stack 1800, i.e. the protective film 107 and the overcoat layer 108. Because the anode 120 is formed after formation of the interlayer insulation stack 1800, after the overcoat layer 108 is formed, the anode 120 is formed around the emission area EA, and subsequently, the bank 150 is disposed excluding the emission area EA and a portion of the non-emission area NEA.

In the organic light-emitting display device of the present invention, unlike a structure of the related art in which no auxiliary electrode is provided and the non-emission area is covered with the bank, the bank 150 is patterned above a portion of the auxiliary electrode 130 in the non-emission area so as to protrude further into the first hole 1800b than the interlayer insulation stack 1800, whereby both the first hole 1800b in the interlayer insulation stack 1800 and the bank 150 form an undercut structure above the auxiliary electrode 130. In this case, because the bank 150 is formed after the overcoat layer 108 is formed, the bank 150 may cover not only the top, but also the sidewall of the overcoat layer 108.

Meanwhile, in addition to the first hole 1800b, the first contact hole 1800a is formed in the interlayer insulation stack 1800. The first contact hole 1800a is defined by selectively removing the overcoat layer 108 and the protective film 107 in order to connect the anode 120 of the organic light-emitting diode to a thin-film transistor TFT thereunder. In this case, the thin-film transistor TFT corresponds to the driving thin-film transistor D-Tr illustrated in FIG. 3, and an electrode of the thin-film transistor exposed through the first contact hole 1800a is a portion of a source electrode 106b.

In addition, in the emission area EA, the anode 120, the organic light-emitting layer 121, and the cathode 122 are sequentially disposed on the interlayer insulation stack 1800 to form the organic light-emitting diode. The anode 120 inside the first contact hole 1800a may be connected to the source electrode 106b of the thin-film transistor TFT thereunder, the first contact hole 1800a may be located in a portion of the non-emission area NEA, and the bank 150 may be located on the anode 120 in the first contact hole 1800a.

Now, the structure below the interlayer insulation stack 1800 in FIG. 5 will be described.

The organic light-emitting display device of the present invention includes the thin-film transistor TFT, which is formed in a specific region on the substrate 100 and includes an active layer 102, a gate electrode 103, and the source electrode 106b. In the top-emission type, because light is emitted from the upper side of the anode 120, the thin-film transistor TFT may be located in any one of the emission area and the non-emission area. In the bottom-emission type, because light emission may be limited by the electrode of the thin-film transistor TFT, the thin-film transistor may not be located in the non-emission area.

The active layer 102 may be an amorphous silicon layer, a poly-silicon layer, or an oxide semiconductor layer, and a buffer layer 101 may be provided between the substrate 100 and the active layer 102 in order to prevent foreign substances from being introduced from the substrate 100 to the active layer 102.

Meanwhile, a gate insulation film 105 is provided between the gate electrode 103 and the active layer 102 in order to maintain electrical insulation.

In addition, an interlayer insulation film 104 is further provided on the buffer layer 101 to cover the gate insulation film 105 and the gate electrode 103, which are stacked on the active layer 102.

The active layer 102 is exposed at opposite side portions thereof through a contact hole formed in the interlayer insulation film 104 so that the source electrode 106b and a drain electrode 106a are connected to the opposite side portions of the active layer 102.

Here, the auxiliary electrode 130 is disposed in the same layer as the source electrode 106b and the drain electrode 106a, and the pad electrode 230 is disposed in the same layer as the auxiliary electrode 130 in the edge area of the substrate 100.

The pad electrode 230 in the edge area may be bonded to, for example, an FPC film in order to receive an electrical signal, and to this end, may include an exposed portion. As illustrated, in order to expose a portion of the upper surface of the pad electrode 230, the overcoat layer 108 and the bank 150, excluding the protective film 107 that is an inorganic insulation film, may be removed from the upper surface of the pad electrode 230.

Hereinafter, the method of manufacturing the organic light-emitting display device according to the first embodiment of the present invention will be described with reference to process cross-sectional views.

Figure 6A:
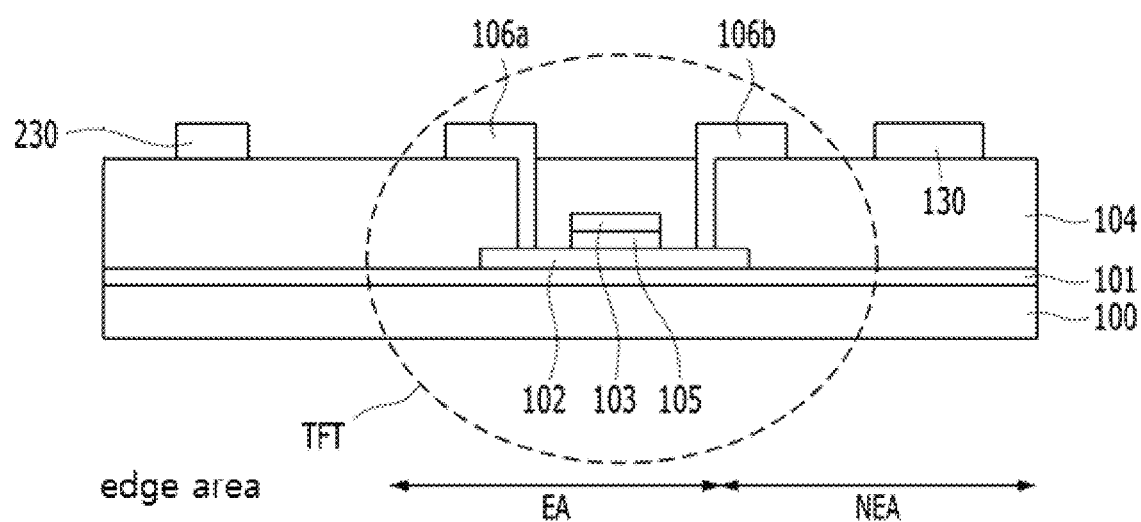
FIGS. 6A to 6E are process cross-sectional views of the organic light-emitting display device illustrated in FIG. 5.
Figure 6B:
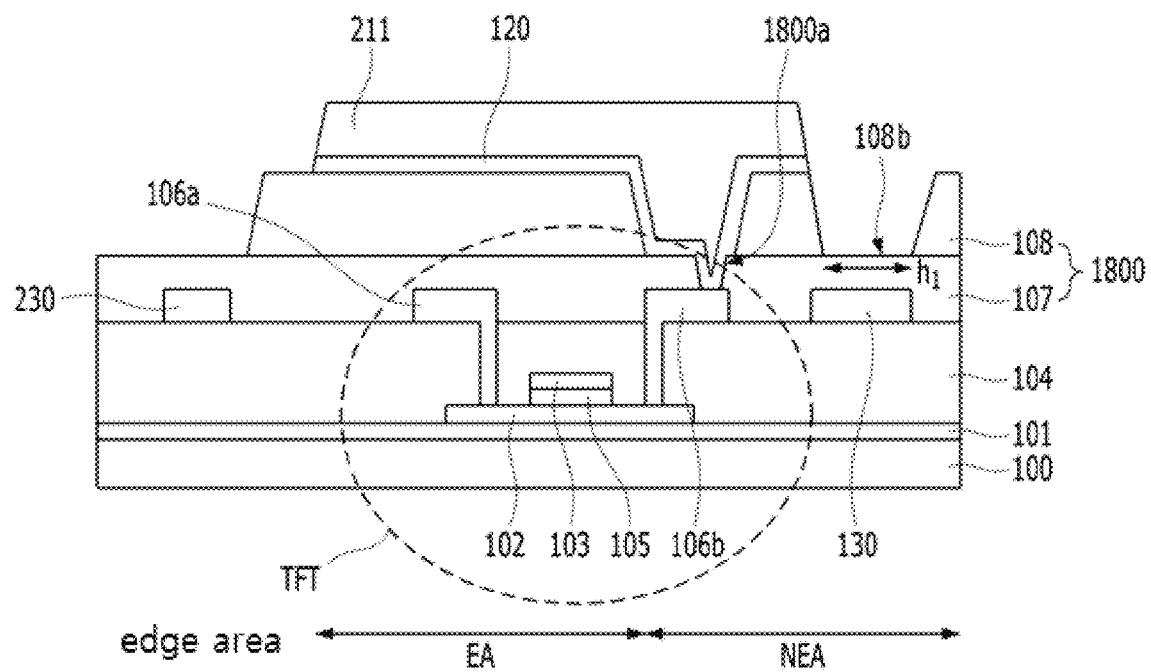
Figure 6C:
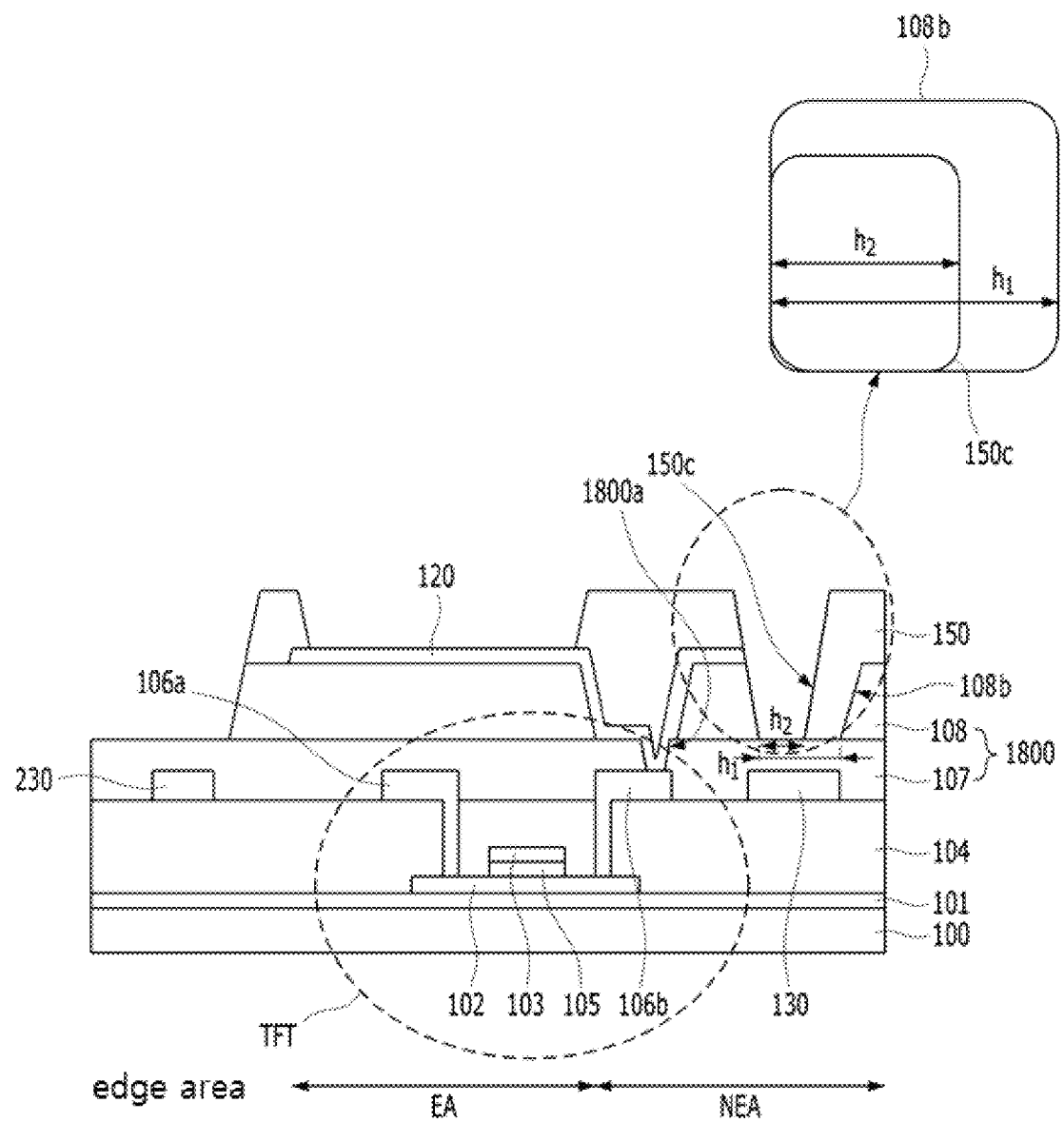
Figure 6D:
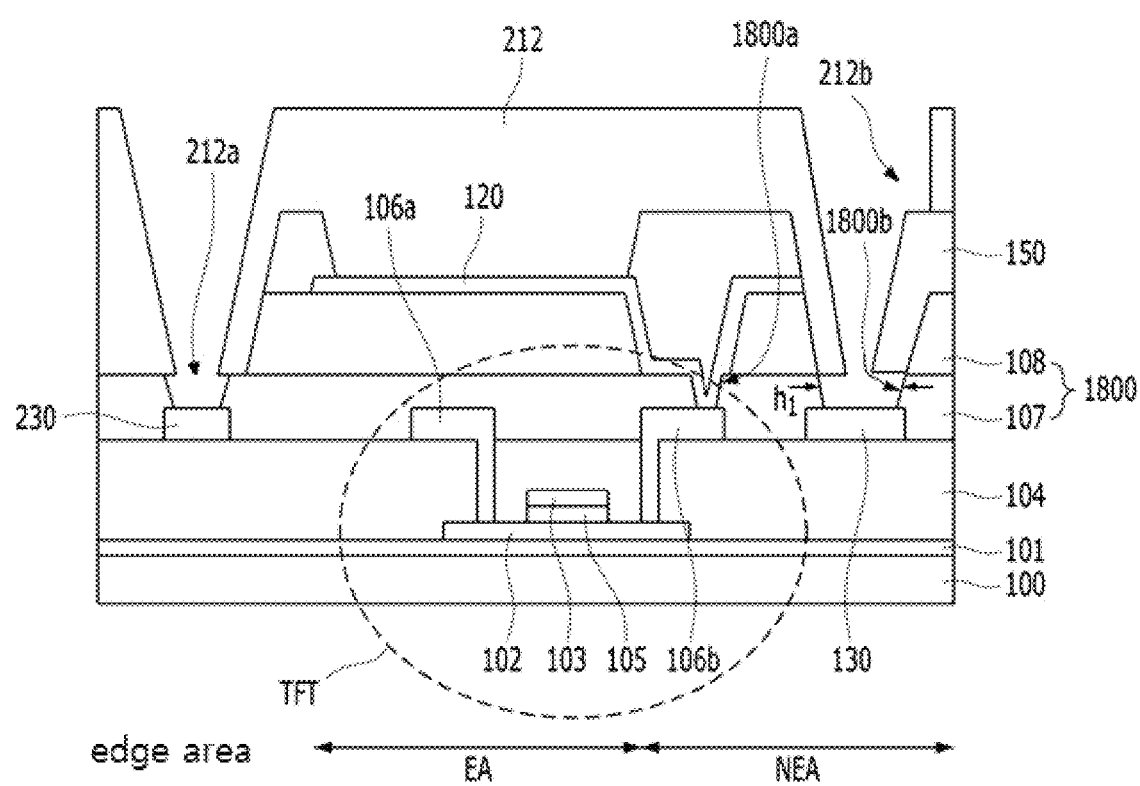
Figure 6E:
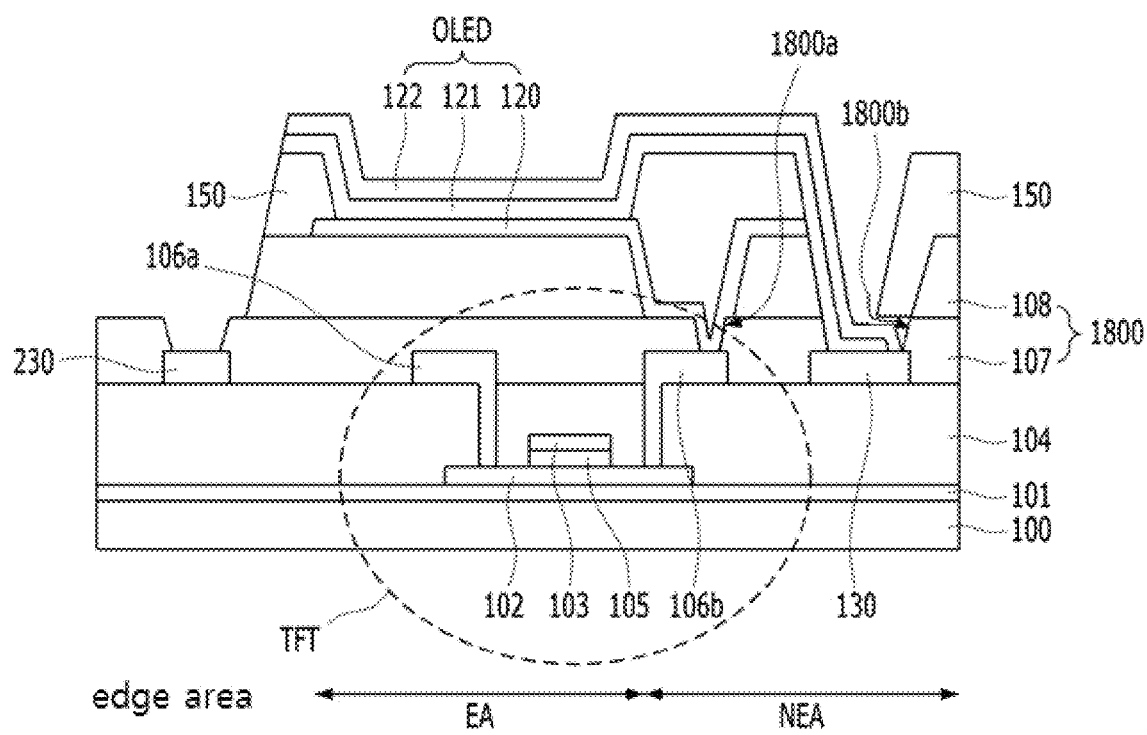
Figure 7:
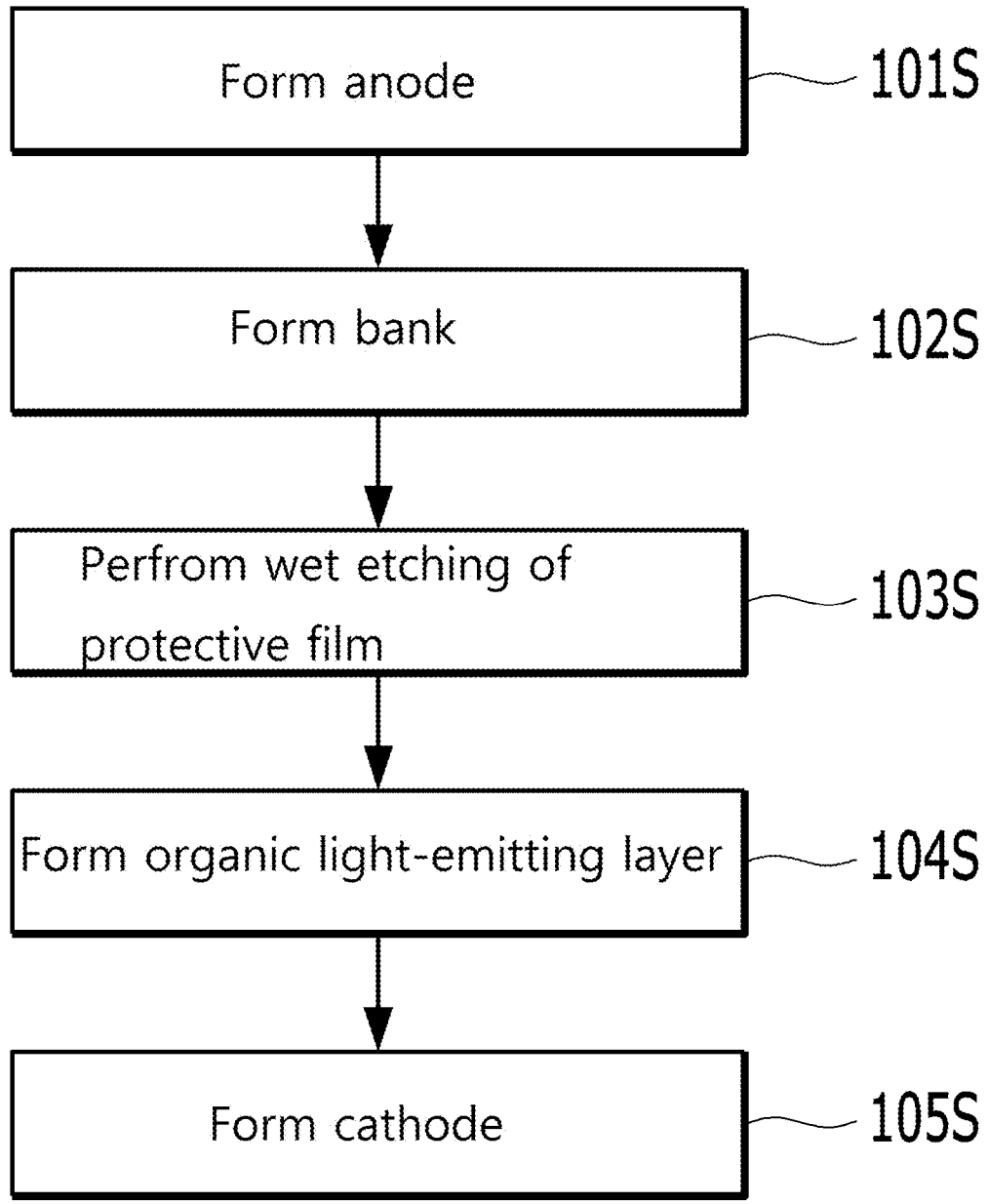
FIG. 7 is a process flowchart of the organic light-emitting display device according to the present invention.

FIGS. 6A to 6E are process cross-sectional views of the organic light-emitting display device illustrated in FIG. 5, and FIG. 7 is a process flowchart of the organic light-emitting display device according to the present invention.

In the organic light-emitting display device of the present invention, because the manufacturing process thereof starting from the formation of the interlayer insulation stack is important, a detailed description about the thin-film transistor that is formed before the formation of the interlayer insulation stack will be omitted.

As illustrated in FIG. 6A, the buffer layer 101 is formed on the substrate 100, and the active layer 102 is formed in a specific region of the sub-pixel. Subsequently, the gate insulation film 105 and the gate electrode 103 are sequentially formed on a specific portion of the top of the active layer 102, and the interlayer insulation film 104, which has a contact hole for exposing opposite side portions of the active layer 102 and covers the remaining portion of the active layer 102, is formed.

Subsequently, a metal is deposited and selectively patterned to form the source electrode 106b and the drain electrode 106a, which are connected respectively to the opposite side portions of the active layer 102 exposed through the contact hole, the auxiliary electrode 130, which is formed in a portion of the non-emission area NEA and has a shape illustrated in FIG. 4, and the pad electrode 230 in the edge area. Through this process, the thin-film transistor TFT, which includes the active layer 102, the gate electrode 103, the source electrode 106b, and the drain electrode 106a, is formed.

Here, flattened portions of the source electrode 106b and the drain electrode 106a of the thin-film transistor TFT, the auxiliary electrode 130, and the pad electrode 230 are disposed in the same layer on the interlayer insulation film 104.

Subsequently, referring to FIG. 6B, the protective film 107 is formed on the interlayer insulation film 104 including the thin-film transistor TFT, the auxiliary electrode 130, and the pad electrode 230. The protective film 107 is formed of an inorganic insulation material.

Subsequently, the overcoat layer 108 is formed on the protective film 107. The overcoat layer 108 is formed of an organic insulation material.

The overcoat layer 108 and the protective film 107 are defined by a photoresist pattern, which is formed by applying a photoresist (not illustrated) thereon, and thereafter patterning the photoresist via exposure and developing processes using a single mask. At this time, when the photoresist is of a positive type, in the mask, a portion thereof for leaving all of the overcoat layer 108 and the protective film 107 is defined as a shield portion, a portion thereof for removing only the overcoat layer 108 is defined as a semi-transmissive portion, and a portion thereof for removing all of the overcoat layer 108 and the protective film 107 is defined as a transmissive portion. In addition, when the photoresist is of a negative type, the shield portion and the transmissive portion are reversed from the case of the positive type.

Accordingly, the photoresist pattern on the overcoat layer 108 completely exposes a portion of the top of the source electrode 106b, but thinly remains around the completely exposed portion of the source electrode 106b and on regions corresponding to the pad electrode 230 and the auxiliary electrode 130.

Through the use of the photoresist pattern, the exposed portions of the overcoat layer 108 and the protective film 107 are primarily removed, as illustrated in FIG. 6B, whereby the first contact hole 1800a is formed in the region that is completely exposed by the photoresist pattern.

Subsequently, the photoresist pattern, which has thinly remained, is asked, and then an exposed portion of the overcoat layer 108, which is disposed above the auxiliary electrode 130 and the pad electrode 230 and around the first contact hole 1800a, is removed, whereby the interlayer insulation stack 1800 including the overcoat layer 108 and the protective film 107 is formed. Here, an overcoat layer hole 108b, which has a diameter h1 that is similar to or smaller than the width of the auxiliary electrode 130, is formed above the auxiliary electrode 130, and a portion of the overcoat layer 108 above the pad electrode 230 is removed. At this time, the top of the auxiliary electrode 130 and the top of the pad electrode 230 are covered with the protective film 107.

Subsequently, an anode material is deposited over the entire surface including the first contact hole 1800a, and the anode 120 remains on a specific portion of the emission area EA including the first contact hole 1800a through a first PR pattern 211 (101S). The anode 120 remains on the overcoat layer 108 and inside the first contact hole 1800a.

Subsequently, the first PR pattern 211 is removed.

Subsequently, after a bank material is applied, as illustrated in FIG. 6C, the bank 150 remains so as to be located in a portion of the overcoat layer hole 108b in the non-emission area NEA (102S). Here, a bank hole 150c is formed inside the overcoat layer hole 108b, and has a diameter h2 that is smaller than the diameter h1 of the overcoat layer hole 108b. In this case, the bank 150 is shaped to surround the overcoat layer 108 in one side (the right side of the drawing) of the overcoat layer hole 108b.

Subsequently, as illustrated in FIG. 6D, the protective film 107 is removed using a second PR pattern 212 to expose the pad electrode 230 and the auxiliary electrode 130. The second PR pattern 212 has a first PR pattern hole 212a, which exposes a portion of the top of the pad electrode 230 that has a smaller width than the width of the pad electrode 230 to be exposed, and a second PR pattern hole 212b, which exposes the sidewall and a portion of the top of the bank 150, which surrounds the overcoat layer 108 and protrudes into the second PR pattern hole 212b to cover a portion of the auxiliary electrode 130. Here, because etching of the protective film 107 using the second PR pattern 212 is isotropic wet etching for selectively etching only the protective film 107, such etching is performed over a width that is greater than the distance between the bank 150 and the second PR pattern 212 disposed on the upper surface of the protective film 107 above the auxiliary electrode 130, whereby the first hole 1800b in the interlayer insulation stack 1800 is defined (103S). In this process, the etching target is the protective film 107, and the bank 150 is not affected by the etching process targeting the protective film 107. That is, the protective film 107 on the auxiliary electrode 130 is etched to form a hole, which has a diameter of approximately h1, defined in FIG. 6B, at the upper surface of the protective film 107 and is downwardly tapered. The hole in the upper surface of the completely etched protective film 107 has the diameter h1, and the surface of the bank 150 is located inside the hole. In addition, the bank 150 is vertically spaced apart from the auxiliary electrode 130 by the space remaining after the removal of the protective film 107 and overlaps a portion of the auxiliary electrode 130 when viewed in plan.

Subsequently, the second PR pattern 212 is removed.

Subsequently, as illustrated in FIG. 6E, the organic light-emitting layer 121 is formed in the emission area EA and the non-emission area NEA (104S). In this process, because an organic light-emitting material tends to be straightly deposited in a vertical direction and the bank 150 protrudes from the interlayer insulation stack 1800 above the auxiliary electrode 130, substantially no organic light-emitting material is deposited on the region in which the bank 150 overlaps the auxiliary electrode 130. Meanwhile, the organic light-emitting layer 121 may be deposited on the upper surface of the portion of the auxiliary electrode 130 that does not overlap the protruding pattern of the bank 150.

Subsequently, the cathode 122 is formed to cover the organic light-emitting layer 122 (105S). In the emission area EA, the cathode 122 is disposed on the organic light-emitting layer 121, and constitutes the organic light-emitting diode along with the organic light-emitting layer 121 and the anode 120 thereunder. In addition, in the non-emission area NEA, the cathode 122 is disposed on the organic light-emitting layer 121 in the region in which the bank 150 and the auxiliary electrode 130 do not overlap each other. However, in the region in which the bank 150 and the auxiliary electrode 130 overlap each other, the cathode 122 may directly contact the auxiliary electrode 130 because no organic light-emitting layer 121 is formed.

In the method of manufacturing the organic light-emitting display device of the present invention described above, because no partition wall is formed on the auxiliary electrode 130, as can be seen from FIG. 7, formation of an organic light-emitting diode array requires only a reduced number of masks, specifically three masks, for the formation of the anode and for the opening of the bank and the pad electrode.

Second Embodiment

Figure 8:
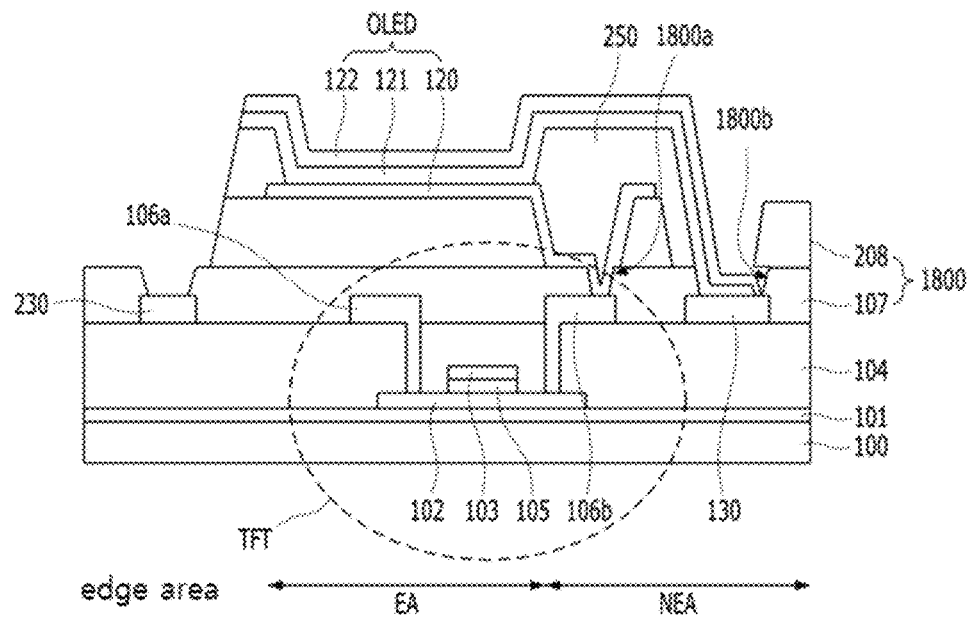
FIG. 8 is a cross-sectional view illustrating an organic light-emitting display device according to a second embodiment of the present invention.

FIG. 8 is a cross-sectional view illustrating an organic light-emitting display device according to a second embodiment of the present invention.

Referring to FIG. 8, in the organic light-emitting display device according to the second embodiment of the present invention, a protruding pattern, which protrudes into the first hole 1800b above the auxiliary electrode 130, is formed by an overcoat layer 208. In this case, as well, when the organic light-emitting layer 121 and the cathode 122 are formed, the cathode 122 is directly deposited on the auxiliary electrode 130 below an undercut structure due to vertical deposition and diffuse-reflection deposition, which enables a reduction in the electrical resistance of the large-area cathode 122.

Here, the protective film 107 is an inorganic insulation film, and the overcoat layer 208 is an organic insulation film. The overcoat layer 208 is disposed in a first direction (e.g., vertical direction) on the protective film.

In addition, in the organic light-emitting display device according to the second embodiment of the present invention, the protective film 107 has the first hole 1800b and the organic insulation film 208 has a first sub-hole, which is smaller than the first hole 1800b. As such, the protruding pattern is defined by the organic insulation film 208, which protrudes into the first hole 1800b in a second direction (e.g., horizontal direction) intersecting the first direction. The shapes of the holes formed in this process will be described below in detail with reference to FIG. 9C.

In this case, the interlayer insulation stack may be considered to be the inorganic insulation film 107, which is formed as a single layer having the first hole 1800b and the first contact hole 1800a therein, and the overcoat layer 208, which is located above the inorganic insulation film 107 and is formed as an organic insulation film, may be considered to be a protruding pattern provided on the interlayer insulation stack.

FIGS. 9A to 9D are process cross-sectional views of the organic light-emitting display device illustrated in FIG. 8.

In the organic light-emitting display device according to the second embodiment of the present invention, similarly, the formation of the thin-film transistor is known, and thus a description thereof will be omitted.

Figure 9A:
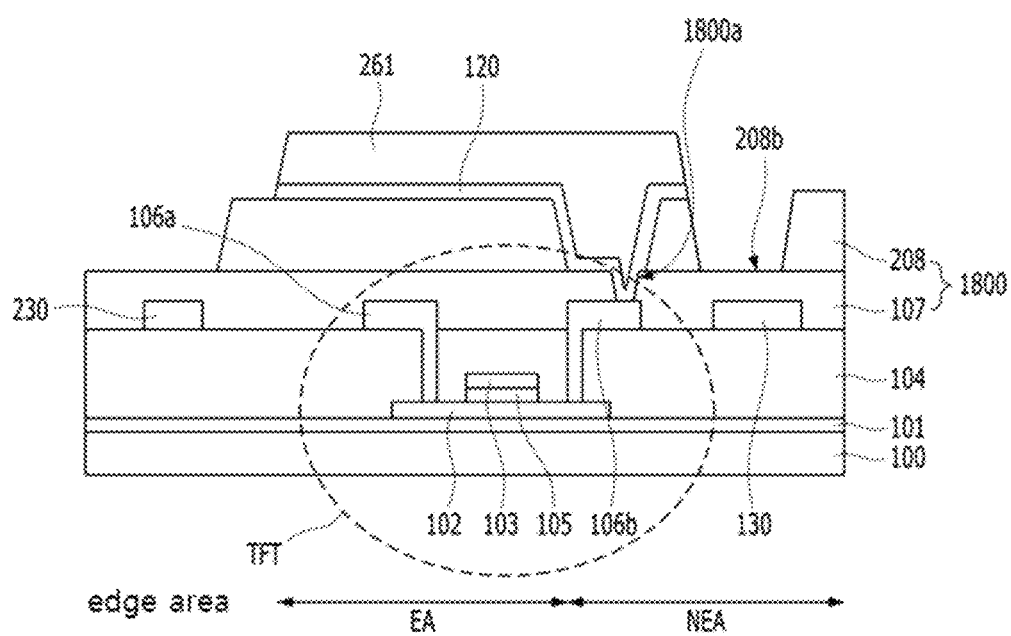
FIGS. 9A to 9D are process cross-sectional views of the organic light-emitting display device illustrated in FIG. 8.

As illustrated in FIG. 9A, the substrate 100, which includes the thin-film transistor TFT, the auxiliary electrode 130, and the pad electrode 230, is prepared (see FIG. 6A).

The flattened portions of the source electrode 106b and the drain electrode 106a of the thin-film transistor TFT, the auxiliary electrode 130, and the pad electrode 230 are disposed in the same layer on the interlayer insulation film 104.

Subsequently, the protective film 107, which is formed of an inorganic insulation material, is disposed on the interlayer insulation film 104 including the thin-film transistor TFT, the auxiliary electrode 130, and the pad electrode 230.

Subsequently, the overcoat layer 208 is formed on the protective film 107.

The overcoat layer 208 and the protective film 107 are defined by a photoresist pattern, which is formed by applying a photoresist (not illustrated) thereon, and thereafter patterning the photoresist via exposure and developing processes using a single mask. At this time, when the photoresist is of a positive type, in the mask, a portion thereof for leaving all of the overcoat layer 208 and the protective film 107 is defined as a shield portion, a portion thereof for removing only the overcoat layer 208 is defined as a semi-transmissive portion, and a portion thereof for removing all of the overcoat layer 208 and the protective film 107 is defined as a transmissive portion. In addition, when the photoresist is of a negative type, the shield portion and the transmissive portion are reversed.

Accordingly, the photoresist pattern in the overcoat layer 208 completely exposes a portion of the top of the source electrode 106b, but thinly remains around the completely exposed portion of the source electrode 106b and on regions corresponding to the pad electrode 230 and the auxiliary electrode 130.

Through the use of the photoresist pattern, the exposed portions of the overcoat layer 208 and the protective film 107 are primarily removed, as illustrated in FIG. 9A, whereby the first contact hole 1800a is formed in the region that is completely exposed by the photoresist pattern.

Subsequently, the photoresist pattern, which has thinly remained, is asked, and then an exposed portion of the overcoat layer 208, which is disposed above the auxiliary electrode 130 and the pad electrode 230 and around the first contact hole 1800a, is removed. Here, an overcoat layer hole 208b is defined by removing the overcoat layer 208 above the auxiliary electrode 130.

The auxiliary electrode 130 and the pad electrode 230 are covered with the protective film 107.

Subsequently, an anode material is deposited over the entire surface including the first contact hole 1800a, and the anode 120 remains in a specific portion of the emission area EA including the first contact hole 1800a through a first PR pattern 261. The anode 120 remains inside the first contact hole 1800a and on the top of the overcoat layer 208, and is connected to the source electrode 106b of the thin-film transistor TFT.

Subsequently, the first PR pattern 261 is removed.

Figure 9B:
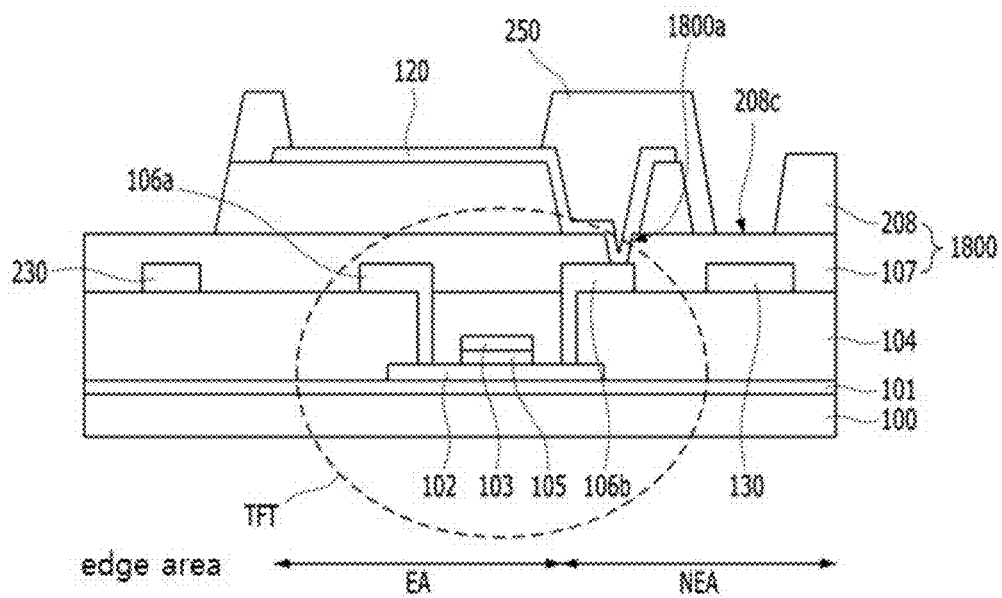
Figure 9C:
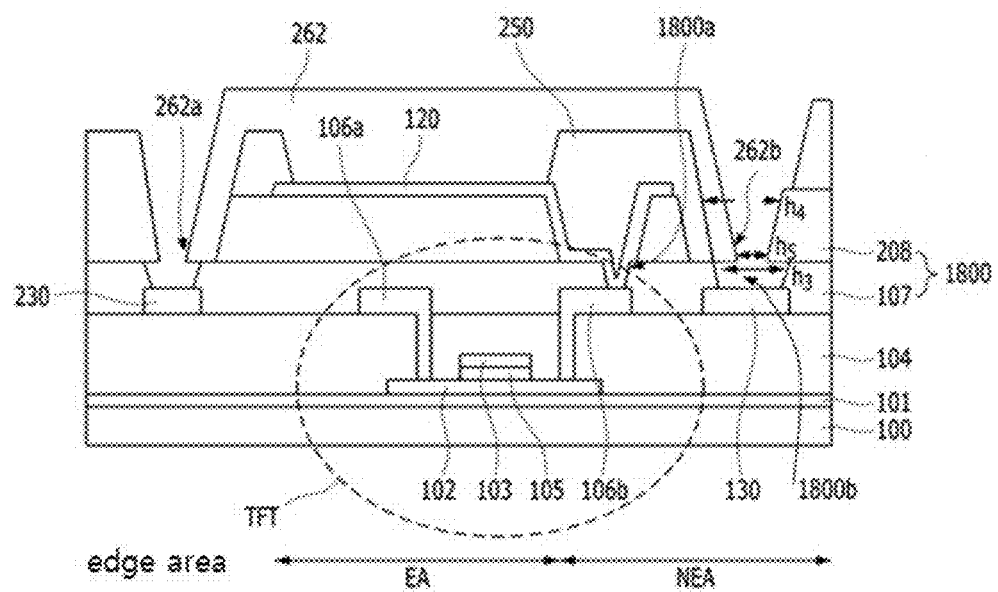

Subsequently, after a bank material is applied, as illustrated in FIG. 9B, a bank 250 remains in the non-emission area NEA. In this process, a portion of the bank material above the auxiliary electrode 130 is removed to form a bank hole 208c in a region of the overcoat layer hole 208b in the non-emission area NEA. In this case, a portion of the bank 250 is located inside the overcoat layer hole 208b (see FIG. 9A), and thus the bank hole 208c is smaller than the overcoat layer hole 208b. That is, one side in the overcoat hole layer 208b may be covered with the bank 250, and the other side may not be covered with the bank 250. Subsequently, as illustrated in FIG. 9C, the protective film 107 is removed to expose the pad electrode 230 and the auxiliary electrode 130 using a second PR pattern 262. The second PR pattern 262 is shaped to cover the bank 250 on the overcoat layer 208 and to expose the portion of the overcoat layer 208 on which the bank 250 is not disposed. That is, a second PR pattern hole 262b, which is defined by the second PR pattern 262 and the overcoat layer 208 above the auxiliary electrode 130, has a fifth diameter h5, which is smaller than the fourth diameter h4 of the bank hole 208c defined in FIG. 9B. In addition, a first PR pattern hole 262a is formed above the pad electrode 230 to expose a width that is smaller than the width of the pad electrode 230 to be exposed.

Here, because etching of the protective film 107 using the second PR pattern 262 is isotropic wet etching, the etching is performed to form holes that are wider than the holes 262a and 262b, which are formed in the upper surface of the protective film 107 using the second PR pattern 262. Thus, the first hole 1800b in the etched protective film 107 on the auxiliary electrode 130 has a third diameter h3 that is greater than the fifth diameter h5 of the second PR pattern hole 262b in the second PR pattern 262, and the overcoat layer 208 on the protective film 107 has an interface hole having a diameter that is smaller than the third diameter h3 of the first hole 1800b in the protective film 107. In this case, when viewed from the right side, after the protective film 107 is etched, the overcoat layer 208 protrudes inward from the protective film 107. Thus, an undercut structure in which an upper pattern protrudes from a lower pattern is defined.

Here, the first hole 1800b is defined in the protective film 107, which is formed as a single layer, and the undercut structure is defined based on the relationship between the overcoat layer 208 and the protective film 107, which is etched more than the overcoat layer 208.

Subsequently, the second PR pattern 262 is removed.

Figure 9D:
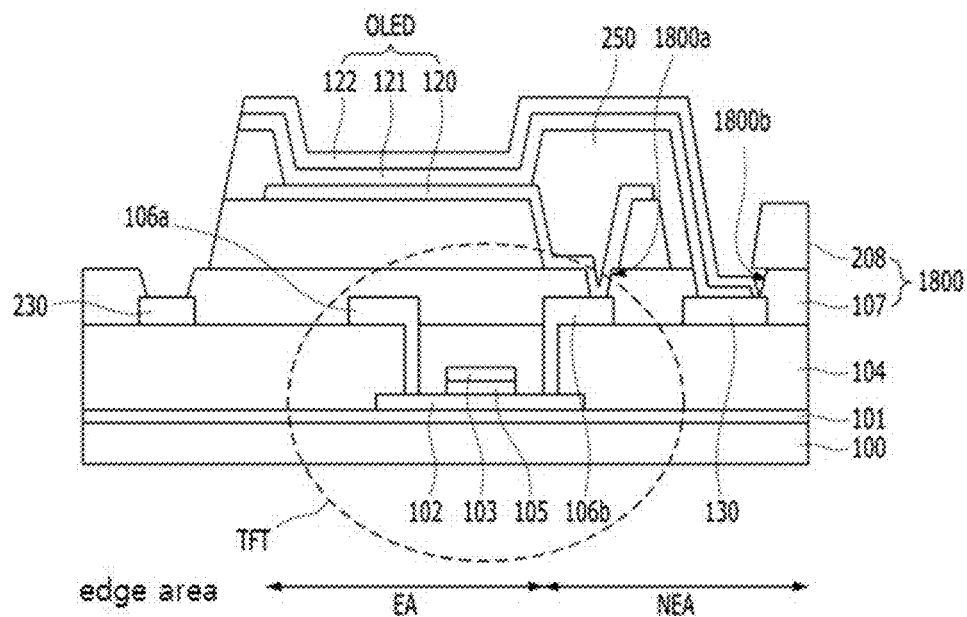

Subsequently, as illustrated in FIG. 9D, the organic light-emitting layer 121 is formed in the emission area EA and the non-emission area NEA. With regard to the non-emission area NEA, no organic light-emitting layer 121 is substantially formed in the region in which the overcoat layer 208, which protrudes into the first hole 1800b above the auxiliary electrode 130, overlaps the auxiliary electrode 130 because an organic light-emitting material tends to be straightly deposited. The completely deposited organic light-emitting material 121 is disposed on the anode 120 in the emission area EA and on the bank 250 in the non-emission area NEA.

Subsequently, the cathode 122 is formed on the organic light-emitting layer 121 in the emission area EA and the non-emission area NEA. At this time, because of diffuse reflection and random surface deposition of metal particles constituting the cathode 122, the cathode 122 may be deposited in the region of the non-emission area NEA in which the overcoat layer 208 and the auxiliary electrode 130 overlap each other and in which the organic light-emitting layer 121 is not disposed. Accordingly, direct connection between the auxiliary electrode 130 and the cathode 122 is possible.

In the second embodiment described above, because the pad electrode 230 is exposed in the state in which the bank 250 formed on the protective film 107 is covered with the second PR pattern 262, the reflow of the overcoat layer 208 may be prevented during the application of heat, such as the curing of the bank 250. That is, because an undercut structure in the interlayer insulation stack 1800 is formed by patterning the inorganic protective film 107 below the overcoat layer 208 after the bank 250 is formed in a thermal process, it is possible to prevent collapse of the overcoat layer 208, or to prevent a portion of the bank 250 from remaining in the undercut region. In this case, in the step of forming the bank 250, the pad electrode 230 and the auxiliary electrode 130 are protected by the inorganic protective film 107.

Third Embodiment

Figure 10:
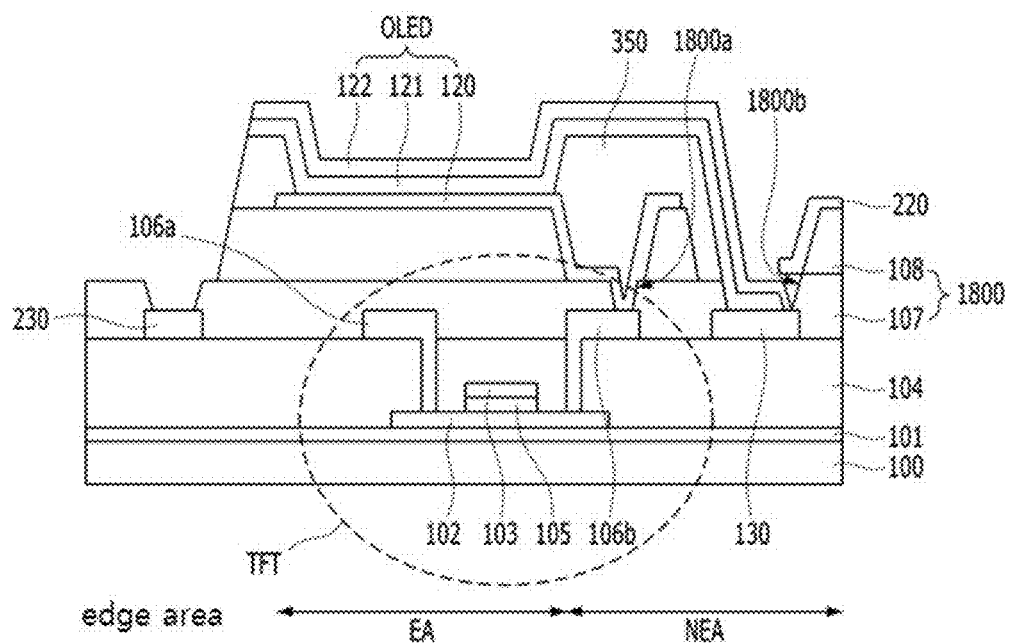
FIG. 10 is a cross-sectional view illustrating an organic light-emitting display device according to a third embodiment of the present invention.

FIG. 10 is a cross-sectional view illustrating an organic light-emitting display device according to a third embodiment of the present invention.

As illustrated in FIG. 10, in the organic light-emitting display device according to the third embodiment, a protruding pattern, which protrudes into the first hole 1800b above the auxiliary electrode 130, is formed by an anode dummy pattern 220. The anode dummy pattern 220 is formed on the overcoat layer 108 in a first direction (e.g., vertical direction), and the protruding pattern of the anode dummy pattern 220 protrudes into the first hole 1800b in a second direction (e.g., horizontal direction) intersecting the first direction. Even in this case, when the organic light-emitting layer 121 and the cathode 122 are formed, the cathode 122 is directly deposited on the auxiliary electrode 130 below an undercut structure in the region in which the auxiliary electrode 130 and the anode dummy pattern 220 overlap each other due to vertical deposition and diffuse-reflection deposition, which enables a reduction in the electrical resistance of the large-area cathode 122.

FIGS. 11A to 11D are process cross-sectional views of the organic light-emitting display device illustrated in FIG. 10.

In the organic light-emitting display device according to the third embodiment of the present invention, similarly, the formation of the thin-film transistor is known, and thus a description thereof will be omitted.

Figure 11A:
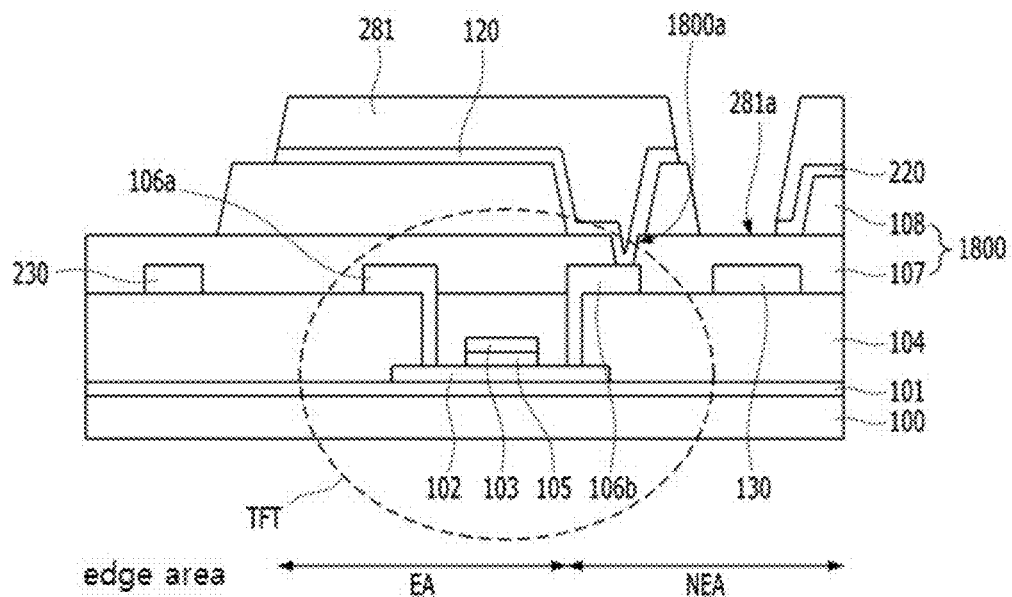
FIGS. 11A to 11D are process cross-sectional views of the organic light-emitting display device illustrated in FIG. 10.

As illustrated in FIG. 11A, the substrate 100, which includes the thin-film transistor TFT, the auxiliary electrode 130, and the pad electrode 230, is prepared (see FIG. 6A).

The flattened portions of the source electrode 106b and the drain electrode 106a of the thin-film transistor TFT, the auxiliary electrode 130, and the pad electrode 230 are disposed in the same layer on the interlayer insulation film 104.

Subsequently, the protective film 107, which is formed of an inorganic insulation material, is disposed on the interlayer insulation film 104 including the thin-film transistor TFT, the auxiliary electrode 130, and the pad electrode 230.

Subsequently, the overcoat layer 108 is formed on the protective film 107.

The overcoat layer 108 and the protective film 107 are defined by a photoresist pattern, which is formed by applying a photoresist (not illustrated) thereon, and thereafter patterning the photoresist via exposure and developing processes using a single mask. At this time, when the photoresist is of a positive type, in the mask, a portion thereof for leaving all of the overcoat layer 108 and the protective film 107 is defined as a shield portion, a portion thereof for removing only the overcoat layer 108 is defined as a semi-transmissive portion, and a portion thereof for removing all of the overcoat layer 108 and the protective film 107 is defined as a transmissive portion. In addition, when the photoresist is of a negative type, the shield portion and the transmissive portion are reversed.

Accordingly, the photoresist pattern in the overcoat layer 108 completely exposes a portion of the top of the source electrode 106b, but thinly remains around the completely exposed portion of the source electrode 106b and on regions corresponding to the pad electrode 230 and the auxiliary electrode 130. Through the use of the photoresist pattern, the exposed portions of the overcoat layer 108 and the protective film 107 are primarily removed, as illustrated in FIG. 11A, whereby the first contact hole 1800a is formed in the region that is completely exposed by the photoresist pattern.

Subsequently, the photoresist pattern, which has thinly remained, is asked, and then an exposed portion of the overcoat layer 108, which is disposed above the auxiliary electrode 130 and the pad electrode 230 and around the first contact hole 1800a, is removed.

Here, both the protective film 107 and the overcoat layer 108 constitute the interlayer insulation stack 1800. Here, the portion of the overcoat layer 108, which is located above the auxiliary electrode 130 and is wider than the auxiliary electrode 130, is removed from the inorganic protective film 107.

The auxiliary electrode 130 and the pad electrode 230 are covered with the protective film 107.

Subsequently, an anode material is deposited over the entire surface including the first contact hole 1800a, and the anode 120 remains in the corresponding region of the emission area EA that includes the first contact hole 1800a and in the region of the non-emission area NEA that overlaps a portion of the auxiliary electrode 130 through a first PR pattern 281, which has a first PR pattern hole 281a. In addition, the anode dummy pattern 220 remains below the first PR pattern 281 formed in the non-emission area NEA. The anode dummy pattern 220 remains on the top of the protective film 107 above the auxiliary electrode 130 in the non-emission area NEA and on a portion of the top and the sidewall of the overcoat layer 108. In addition, the anode 120 remains on the top of the overcoat layer 108 and in the first contact hole 1800a.

Subsequently, the first PR pattern 281 is removed.

Figure 11B:
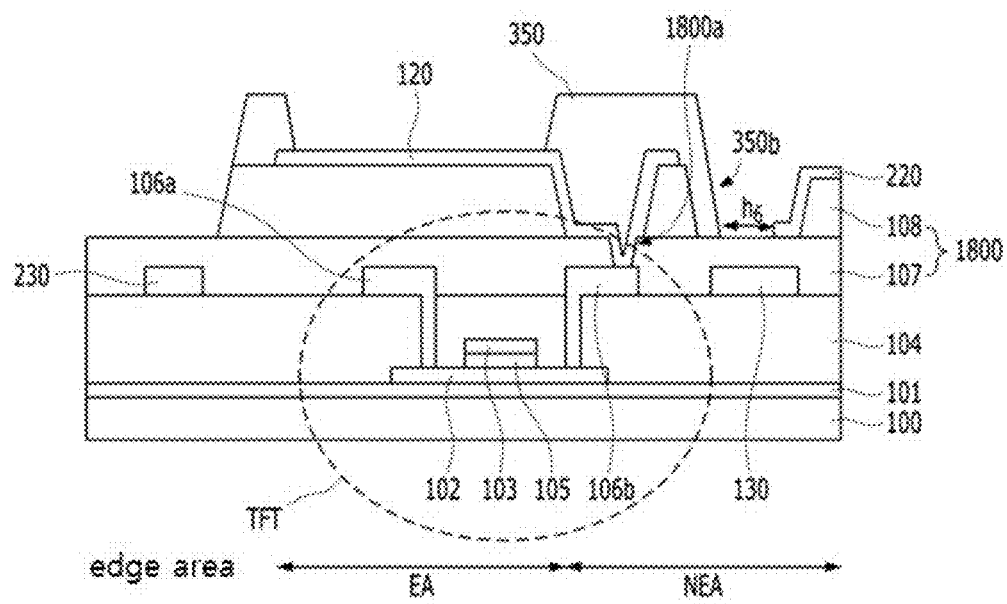

Subsequently, after a bank material is applied, as illustrated in FIG. 11B, a bank 350 covers the overcoat layer 108 that has been exposed in the non-emission area NEA, and has an open region 350b on the protective film 107 above the auxiliary electrode 130. Here, the region of the anode dummy pattern 220 that protrudes from the overcoat layer 108 may be included in the open region 350b via removal of the bank 350. Here, on the upper surface of the protective film 107 above the auxiliary electrode 130, the spacing between the bank 350 and the anode dummy pattern 220 has a sixth diameter h6.

Figure 11C:
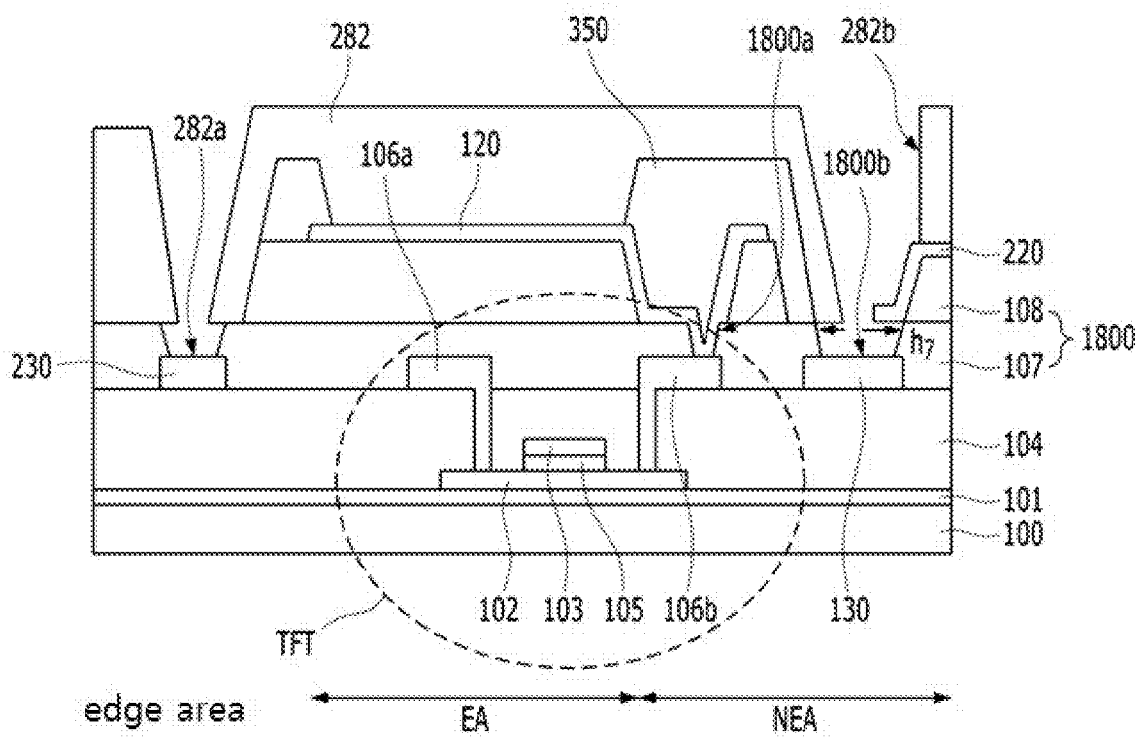

Subsequently, as illustrated in FIG. 11C, the protective film 107 is removed to expose the pad electrode 230 and the auxiliary electrode 130 using a second PR pattern 282, which has a second PR pattern hole 282a corresponding to the pad electrode 230 and a third PR pattern hole 282b corresponding to the auxiliary electrode 130. When the protective film 107 is removed, the second PR pattern 282 covers the bank 350 that has been exposed on the auxiliary electrode 130, and exposes the anode dummy pattern 220 on the auxiliary electrode 130. In addition, because the spacing between the anode dummy pattern 220 and the second PR pattern 282 on the auxiliary electrode 130 is smaller than the sixth diameter h6 defined in FIG. 11B because the second PR pattern 282 covers one side of the bank 350.

However, the inorganic protective film 107 on the auxiliary electrode 130 is subjected to isotropic etching so as to form the first hole 1800b, which has a seventh diameter h7 that is wider than the spacing between the second PR pattern 282 and the anode dummy pattern 220.

That is, the anode dummy pattern 220 protrudes into the first hole 1800 so that an undercut structure is formed in one side of the first hole 1800b by the protruding portion of the anode dummy pattern 220 and the protective film 107 thereunder with respect to the auxiliary electrode 130. In addition, although the second PR pattern hole 282a, which has a width that is smaller than the width of the pad electrode 230 to be exposed, is formed on the pad electrode 230, the second PR pattern hole 282a is etched at a diameter that is greater than the diameter of the first hole 1800b on the upper surface of the protective film 107 via isotropic etching of the protective film 107.

Subsequently, the second PR pattern 282 is removed.

Figure 11D:
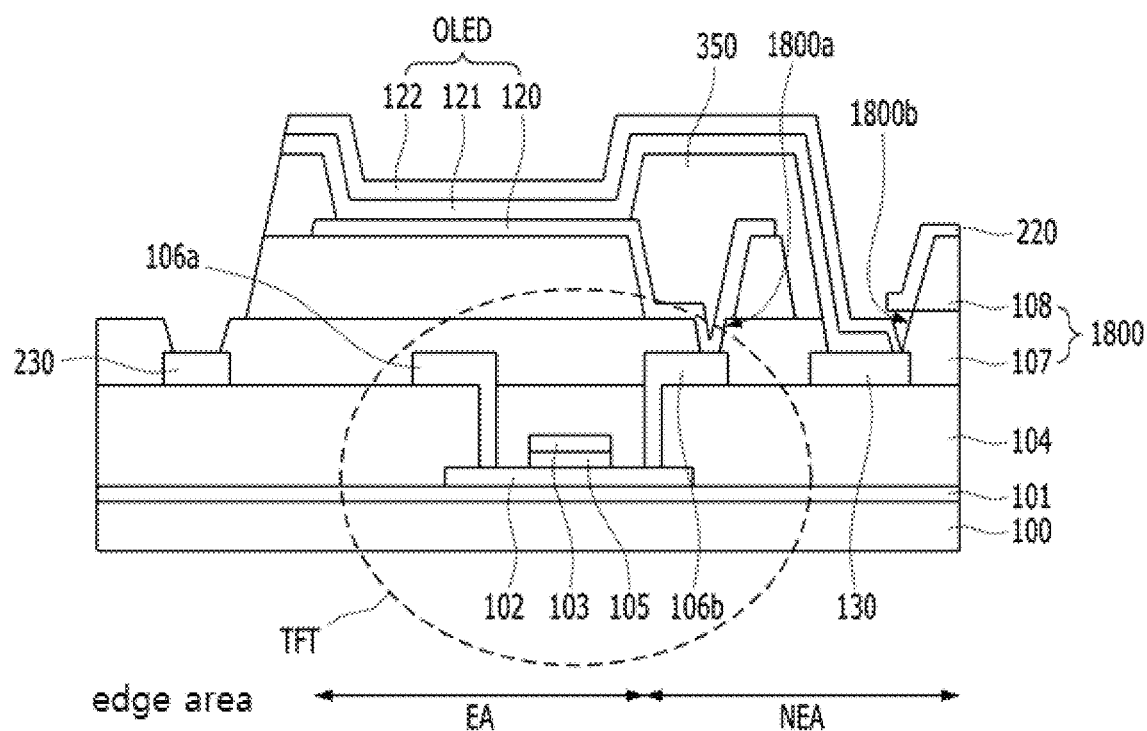

Subsequently, as illustrated in FIG. 11D, the organic light-emitting layer 121 is formed in the emission area EA and the non-emission area NEA. With regard to the non-emission area NEA, no organic light-emitting layer 121 is substantially formed in the region in which the anode dummy pattern 220, which protrudes into the first hole 1800b on the auxiliary electrode 130, overlaps the auxiliary electrode 130 because an organic light-emitting material tends to be straightly deposited in a vertical direction. The completely deposited organic light-emitting material 121 is disposed on the anode 120 in the emission area EA and on the bank 350 in the non-emission area NEA.

Subsequently, the cathode 122 is formed on the organic light-emitting layer 121 in the emission area EA and the non-emission area NEA. At this time, because of diffuse reflection and random surface deposition of metal particles constituting the cathode 122, the cathode 122 may be deposited in the region of the non-emission area NEA in which the anode dummy pattern 220 and the auxiliary electrode 130 overlap each other and in which the organic light-emitting layer 121 is not disposed. Accordingly, direct connection between the auxiliary electrode 130 and the cathode 122 is possible in the region of the first hole 1800b in which the anode dummy pattern 220 and the auxiliary electrode 130 overlap each other.

The anode 120, the organic light-emitting layer 121, and the cathode 122 in the emission area EA function as an organic light-emitting diode.

In the third embodiment described above, because, after the bank 350 is formed on the protective film 107, wet etching of the protective film 107 is performed to expose the pad electrode 230 and to form the first hole 1800b having an undercut shape, the reflow of the overcoat layer 108 may be prevented during the application of heat, such as the curing of the bank 350. That is, because an undercut structure in the interlayer insulation stack 1800 including the overcoat layer 108 and the protective film 107 is formed below the overcoat layer 108 after the bank 350 is formed in a thermal process, it is possible to prevent collapse of the overcoat layer 108.

Figure 12:
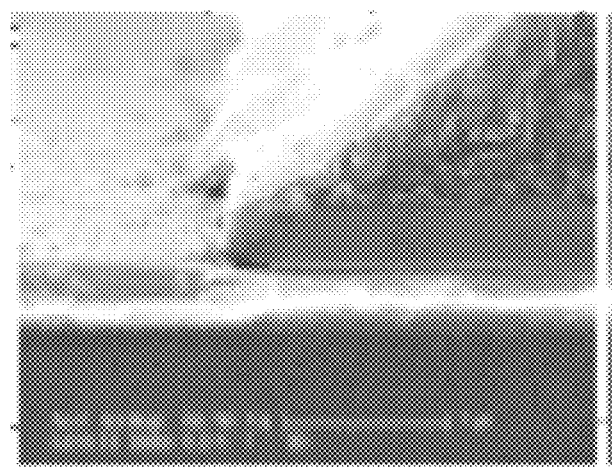
FIG. 12 is an SEM view illustrating the loss of an undercut structure in a connection portion between an auxiliary electrode and a cathode.

FIG. 12 is an SEM view illustrating the loss of the undercut structure of a connection portion between the auxiliary electrode and the cathode.

FIG. 12 is an SEM view illustrating a general method in which the bank is formed after an undercut structure is completely formed in the overcoat layer on the edge of the auxiliary electrode. As illustrated, the overcoat layer no longer has the undercut structure during a thermal process, which is required when forming the bank on the completed undercut structure. In some cases, when the above-described general method is applied, in addition to the loss of the undercut structure, the bank formed of an organic material may remain on the undercut structure, or the reflow of the overcoat layer may occur, which may prevent maintenance of the undercut structure. This means that connection between the cathode and the auxiliary electrode cannot be normally accomplished.

The present invention may prevent this problem by changing the sequence of the process. That is, after the bank is completely formed, etching of the inorganic protective film may be performed to define the undercut structure and to expose the pad electrode. That is, the method of manufacturing the organic light-emitting display device according to the first embodiment and the second embodiment of the present invention may solve the problem of FIG. 12 because the undercut structure is defined via wet etching of the inorganic protective film after the bank is formed.

In addition, in the method of manufacturing the organic light-emitting display device according to the present invention described above, because no partition wall is formed on the auxiliary electrode 130, formation of an organic light-emitting diode array requires only a reduced number of masks, specifically three masks, for the formation of the anode and for the exposure of the bank and the pad electrode.

Figure 13:
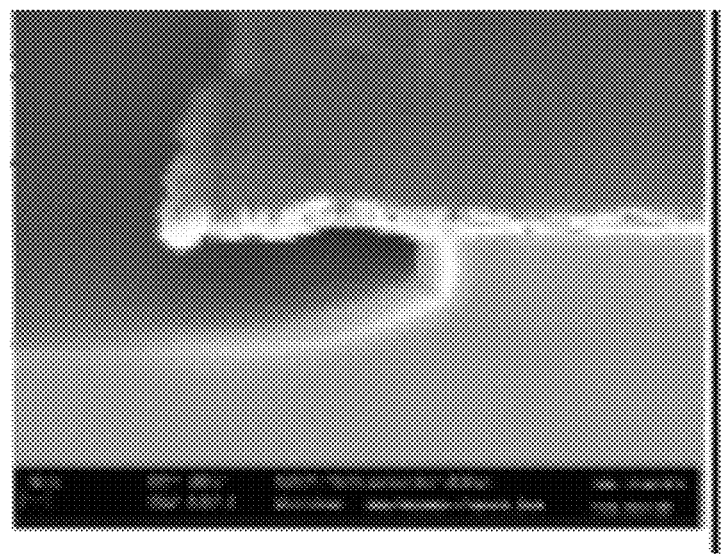
FIG. 13 is an SEM view illustrating the connection portion between the auxiliary electrode and the cathode of FIG. 12.

FIG. 13 is an SEM view illustrating the connection portion between the auxiliary electrode and the cathode of FIG. 12.

As illustrated in FIG. 13, when the protruding anode pattern 220 is provided in the same manner as in the third embodiment, the protruding anode pattern 220 functions to support patterns thereabove so as to prevent the patterns from drooping downward, whereby the reflow of the overcoat layer may be prevented.

Fourth Embodiment

Figure 14:
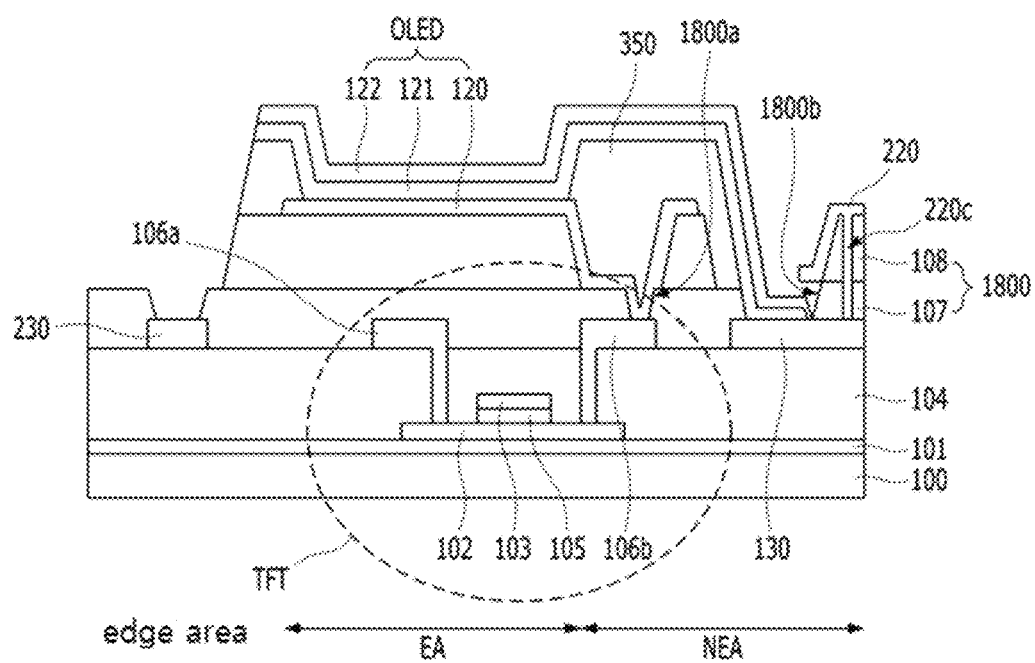
FIG. 14 is a cross-sectional view illustrating an organic light-emitting display device according to a fourth embodiment of the present invention.

FIG. 14 is a cross-sectional view illustrating an organic light-emitting display device according to a fourth embodiment of the present invention.

As illustrated in FIG. 14, in the organic light-emitting display device according to the fourth embodiment of the present invention, a protruding pattern, which protrudes into the first hole 1800b above the auxiliary electrode 130, is formed by the anode dummy pattern 220. Even in this case, when the organic light-emitting layer 121 and the cathode 122 are formed, the cathode 122 is directly deposited on the auxiliary electrode 130 below an undercut structure due to vertical deposition and diffuse-reflection deposition, which enables a reduction in the electrical resistance of the large-area cathode 122. In addition, when the first contact hole 1800*a* is formed to expose the source electrode 106*b*, the overcoat layer 108 and the protective film 107 of the interlayer insulation stack 1800 are removed to form the second contact hole 220*c*, which is spaced apart from the first contact hole 1800*a* and exposes a portion of the auxiliary electrode 130. Subsequently, when the anode 120 and the anode dummy pattern 220 are formed, the anode dummy pattern 220 is connected to the auxiliary electrode 130 through the second contact hole 220*c*, which may increase electrical stability.

A description about the same constituent elements as those of the above-described embodiments will be omitted.

Meanwhile, the undercut structure used in the above-described organic light-emitting display device may also be applied to other regions of the organic light-emitting display device.

Figure 15:
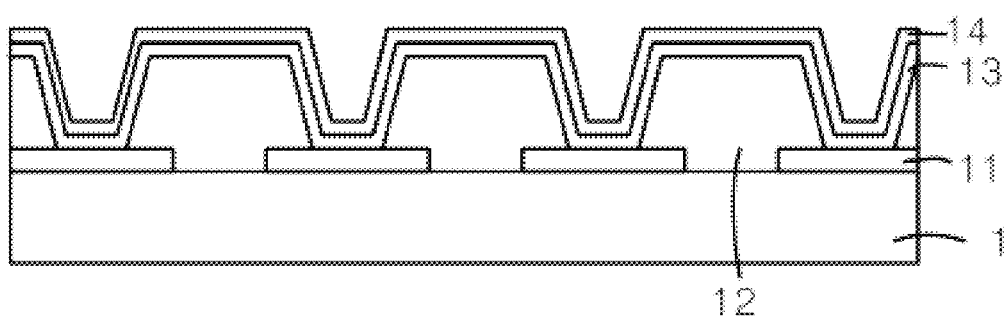
FIG. 15 is a cross-sectional view illustrating an organic light-emitting display device according to a comparative example.

FIG. 15 is a cross-sectional view illustrating an organic light-emitting display device according to a comparative example.

As illustrated in FIG. 15, in the organic light-emitting display device according to the comparative example, anodes 11 are individually located in a plurality of sub-pixels on the substrate 1, and an organic light-emitting layer 12 and a cathode 13 are commonly provided in the sub-pixels.

Meanwhile, in the above-described embodiments and the comparative example, although the organic light-emitting layer 121 or 12 is illustrates as being a single layer, a hole injection layer and a hole transport layer may be provided between the anode 120 or 11 and the organic light-emitting layer 121 or 12, and an electron transport layer and an electron injection layer may be provided between the organic light-emitting layer 121 or 12 and the cathode 122 or 13. In some cases, when a tandem-type organic light-emitting diode is provided between the anode and the cathode, a plurality of stacks may be provided and a charge generation layer may be provided between the stacks.

The hole injection layer may include a dopant having relatively high hole mobility in order to inject holes into the organic light-emitting layer 12 from the anode 11. In addition, because the sub-pixels share common layers including the hole injection layer, even when a signal is supplied to the individual anodes 11 in order to drive specific sub-pixels, lateral current leakage may occur due to the dopant of the hole injection layer having high hole mobility. In addition, in the tandem-type structure, the charge generation layer also has a highly conductive dopant, and thus causes similar problems.

Because the hole injection layer and the charge generation layer are commonly provided in all of the sub-pixels without distinction of the emission area from the non-emission area, even when attempting to drive specific sub-pixels, lateral current leakage may occur due to the highly conductive common layers. Thus, when attempting to drive specific sub-pixels, adjacent sub-pixels may be turned on, which may cause deterioration in color purity.

The lateral current leakage of the organic light-emitting display device according to the comparative example may be solved by the above-described undercut structure. The undercut structure may be defined by the first hole 1800*b* for connection with the above-described auxiliary electrode 130 and a second hole 1800*c* in the interlayer insulation stack 1800. This will be described based on the following embodiments.

Fifth Embodiment

Figure 16:
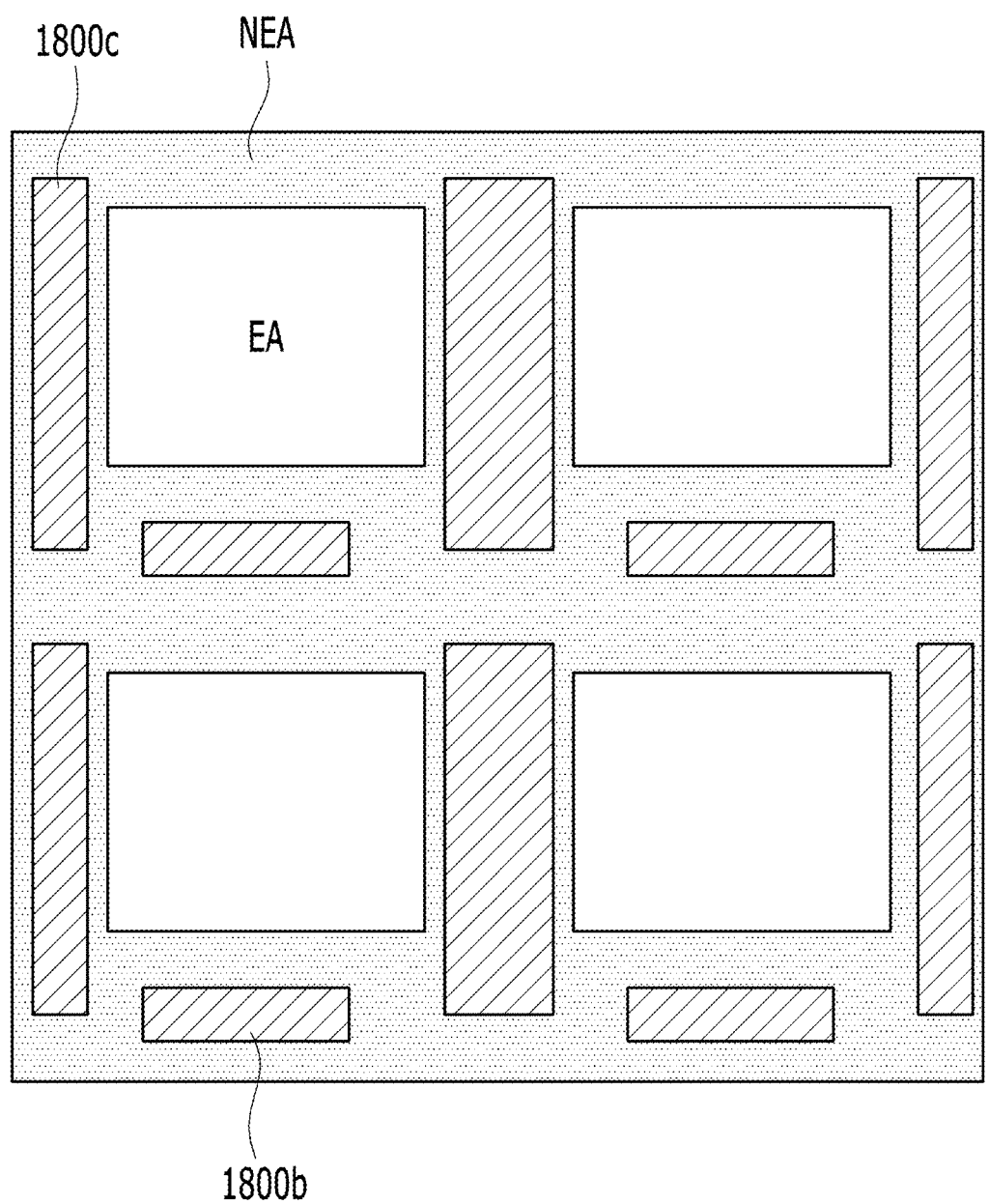
FIG. 16 is a plan view illustrating an organic light-emitting display device according to a fifth embodiment of the present invention.
Figure 17A:
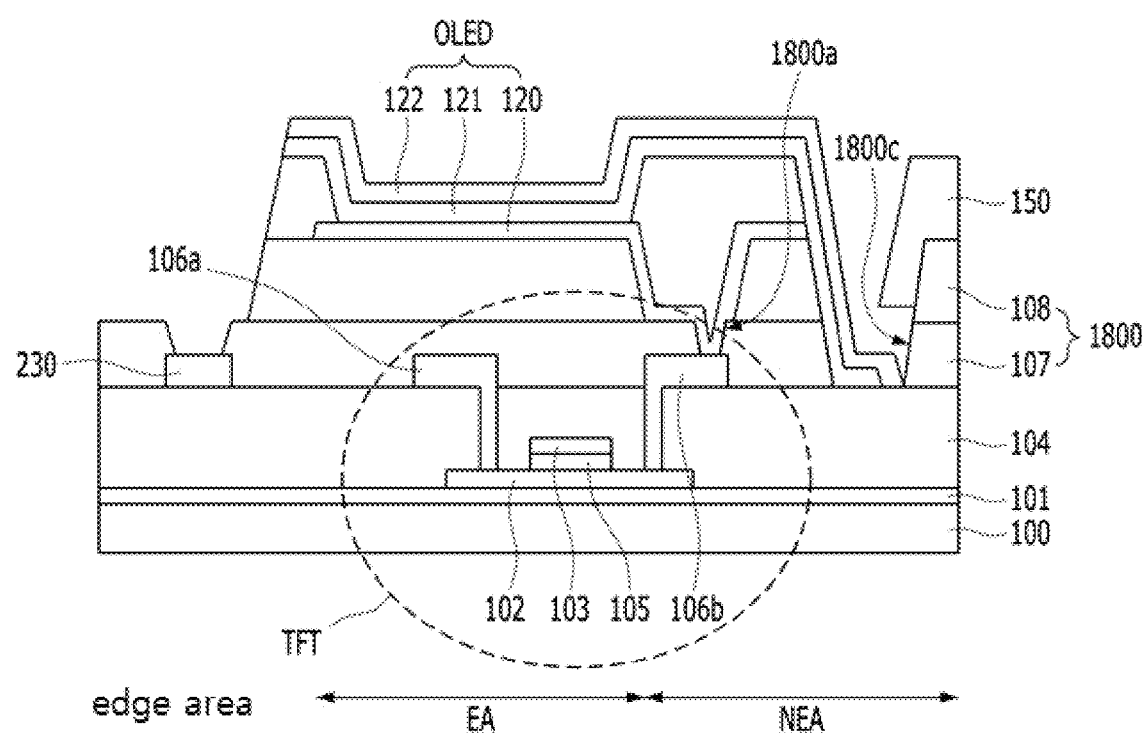
FIGS. 17A to 17C are cross-sectional views illustrating various alternative embodiments of the organic light-emitting display device illustrated in FIG. 16.
Figure 17B:
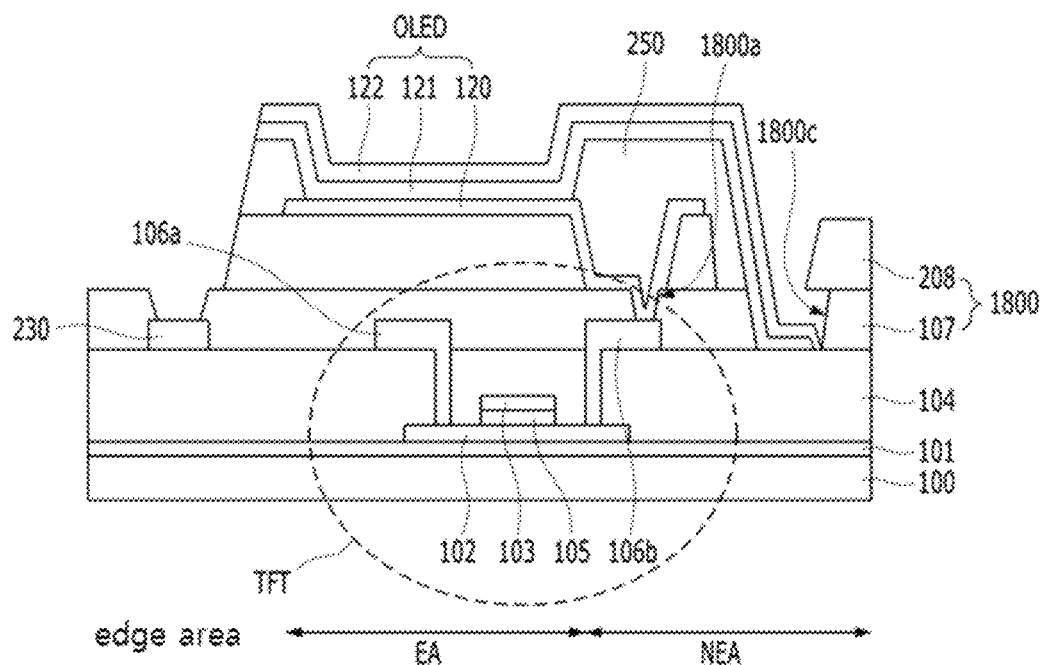
Figure 17C:
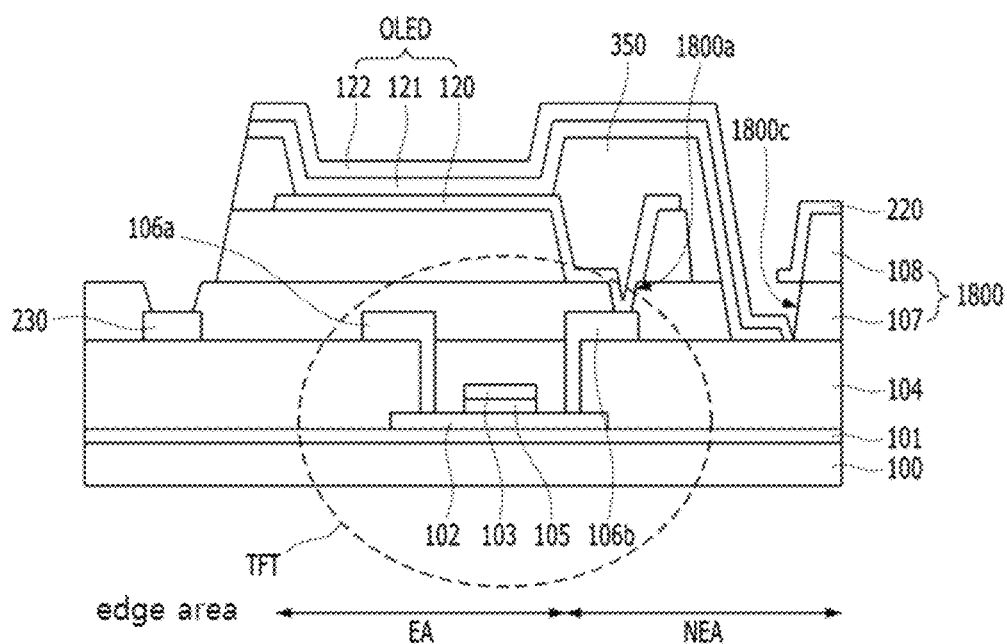

FIG. 16 is a plan view illustrating an organic light-emitting display device according to a fifth embodiment of the present invention, and FIGS. 17A to 17C are cross-sectional views illustrating various alternative embodiments of the organic light-emitting display device illustrated in FIG. 16.

As illustrated in FIG. 16, the organic light-emitting display device according to the fifth embodiment of the present invention includes the second hole 1800*c* of the undercut structure in the interlayer insulation stack 1800 in one side of the non-emission area NEA in which no auxiliary electrode is disposed. In this case, in the fifth embodiment, the second hole 1800*c* is elongated along either side of the emission area EA and is longer than the side of the emission area EA. In this structure, the second hole 1800*c* enables electrical isolation of a common layer including an organic light-emitting layer between sub pixels in the horizontal direction of the emission area EA. The second hole 1800*c* may include a protruding pattern on only one side thereof in the illustrated plan shape, or may include protruding patterns, which are formed on respective sides thereof. That is, a protruding pattern protrudes into the second hole 1800*c* from at least one side of the second hole 1800*c*.

The shape of the undercut structure may be altered in various ways, as illustrated in FIGS. 17A to 17C. These alternative embodiments have a common feature in that common layers including the organic light-emitting layer 121 are separated from each other at one surface or both surfaces of the second hole 1800*c* of the undercut structure so that an organic layer including the organic light-emitting layer 121 between the anode 120 and the cathode 122 forms an electrical isolator between sub-pixels. Thus, lateral current leakage through the organic material may be prevented, which enables selective driving of the sub-pixels and prevents mixing of the colored light from the sub-pixels.

Specifically, the second hole 1800*c* of the undercut structure in the interlayer insulation stack 1800 will be described with reference to cross-sectional views of several embodiments.

The second hole 1800*c* of the undercut structure is formed via the same process as the first hole 1800*b*, which was described with reference to FIGS. 5 to 14. In addition, the protruding pattern (e.g. the bank, the organic insulation film, or the anode dummy pattern) inside the first hole 1800*b* and the protruding pattern inside the second hole 1800*c* may be disposed in the same layer in order to minimize the number of processes.

In the embodiment of FIG. 17A, the second hole 1800*c* does not overlap the first contact hole 1800*a* or the first hole 1800*b* in the non-emission area, and is separated from the interlayer insulation stack 1800 over a distance that is longer than one side of the emission area EA.

The interlayer insulation stack 1800 has the second hole 1800*c*, which is configured to expose a portion of the surface of the interlayer insulation film 104. On the interlayer insulation stack 1800 in a first direction (e.g., vertical direction), there is provided the bank 150, at least one surface of which protrudes into the second hole 1800*c* in a second direction (e.g., horizontal direction) intersecting the first direction so as to cover a portion of the interlayer insulation film 104 inside the second hole 1800*c*, the organic light-emitting layer 121, which is disposed on the interlayer insulation film 104 inside the second hole 1800*c* except for the portion of the interlayer insulation film 104 that is covered with the bank 150, and the cathode 122, which covers the organic light-emitting layer 121 and comes into contact with the portion the interlayer insulation film 104 that is covered with the bank 150.

Here, the organic light-emitting layer 121, as illustrated, may be separated from one surface or both surfaces of the second hole 1800c by the bank 150 in the non-emission area NEA. Thus, the organic light-emitting layer 121 inside the second hole 1800c may be isolated in the second hole 1800c. When the organic light-emitting layer 121 is separated from one surface or both surfaces of the second hole 1800c, the organic light-emitting layer 121 is discontinuously formed between adjacent sub-pixels so as to cut the sharing relationship between the sub-pixels and the organic light-emitting layer 121 or any common layer stacked thereabove or thereunder, which may prevent lateral current leakage. Accordingly, when an electrical signal is selectively applied to the anode 120 of any one sub-pixel, the corresponding sub-pixel may be independently operated, which may prevent a sub-pixel from being undesirably turned on, thereby preventing mixing of colored light and enabling the expression of pure color.

In this structure, when a protruding pattern, which protrudes from the bank 150 into the second hole 1800c, is disposed on the interlayer insulation film 104, the organic light-emitting layer 121, which is deposited without an exposure mask, cannot pass through the region that is covered with the bank 150 because it tends to be straightly deposited. Thus, no organic material is deposited in the region of the second hole 1800c that is covered with the bank 150, which causes disconnection of the organic light-emitting layer 121.

Meanwhile, below the second hole 1800c, the interlayer insulation film 104 may be formed as an inorganic insulation film, which has an etching rate different from the inorganic protective film 107, which is an insulation film that forms a lower layer of the interlayer insulation stack 1800. This serves to distinguish the inorganic protective film 107 from the interlayer insulation film 104 when the second hole 1800c is formed in order to etch the inorganic protective film 107 while allowing the interlayer insulation film 104 to remain.

In the organic light-emitting display device of the present invention, the protruding pattern, which is located above the interlayer insulation film 104 and forms an undercut structure, may be formed by the overcoat layer 108 or 208, or by an anode material layer, in addition to the above-described bank 150, and other concrete examples will be described below.

In the embodiment of FIG. 17B, a protruding pattern, which protrudes from the interlayer insulation stack 1800 into the second hole 1800c, is formed by the overcoat layer 208. Because the overcoat layer 208 protrudes further into the second hole 1800c than the protective film 107, the organic light-emitting layer 121, which strongly tends to be straightly deposited in a vertical direction, may not accumulate below the protruding overcoat layer 208, and the cathode 122 may be directly formed in the vertical space between the protruding overcoat layer 208 and the interlayer insulation film 104 thereunder. Accordingly, even in the present embodiment, isolation of the organic light-emitting layer 121 between sub-pixels is possible. Here, the protective film 107, which is formed of an inorganic insulation material, has the first hole 1800b (see FIG. 8) and the second hole 1800c (see FIG. 17B), and the overcoat layer 208, which is formed of an organic insulation film, has a first sub-hole and a second sub-hole, which are respectively smaller than the first hole and the second hole. In this case, an undercut structure may be defined by the upper overcoat layer 208 and the lower protective film 107, which is subjected to isotropic etching and has a wider open region in the interface than does the overcoat layer 208. The overcoat layer 208 is formed on the protective film 107 in a first direction (e.g., vertical direction), and the protruding pattern of the overcoat layer 208 protrudes into the hole 1800c in a second direction (e.g., horizontal direction) intersecting the first direction.

In the embodiment of FIG. 17C, a protruding pattern, which protrudes into the second hole 1800c, is formed by the anode dummy pattern 220 formed above the interlayer insulation stack 1800 in a first direction (e.g., vertical direction). The anode dummy pattern includes a protruding pattern that protrudes into the hole 1800c in a second direction (e.g., horizontal direction) intersecting the first direction. Even in this case, the protective film 107 below the anode dummy pattern 220 has an undercut structure in the second hole 1800c in the interlayer insulation stack 1800. Thus, no organic light-emitting layer 121 is disposed on the portion of the interlayer insulation film 104 that is vertically spaced apart from the anode dummy pattern 220. Thereby, the organic light-emitting layer 121, which is discontinuously formed between sub-pixels, may prevent lateral current leakage.

Meanwhile, the second hole for preventing lateral current leakage may be shaped to surround each light-emitting portion on a per sub-pixel basis.

Sixth Embodiment

Figure 18:
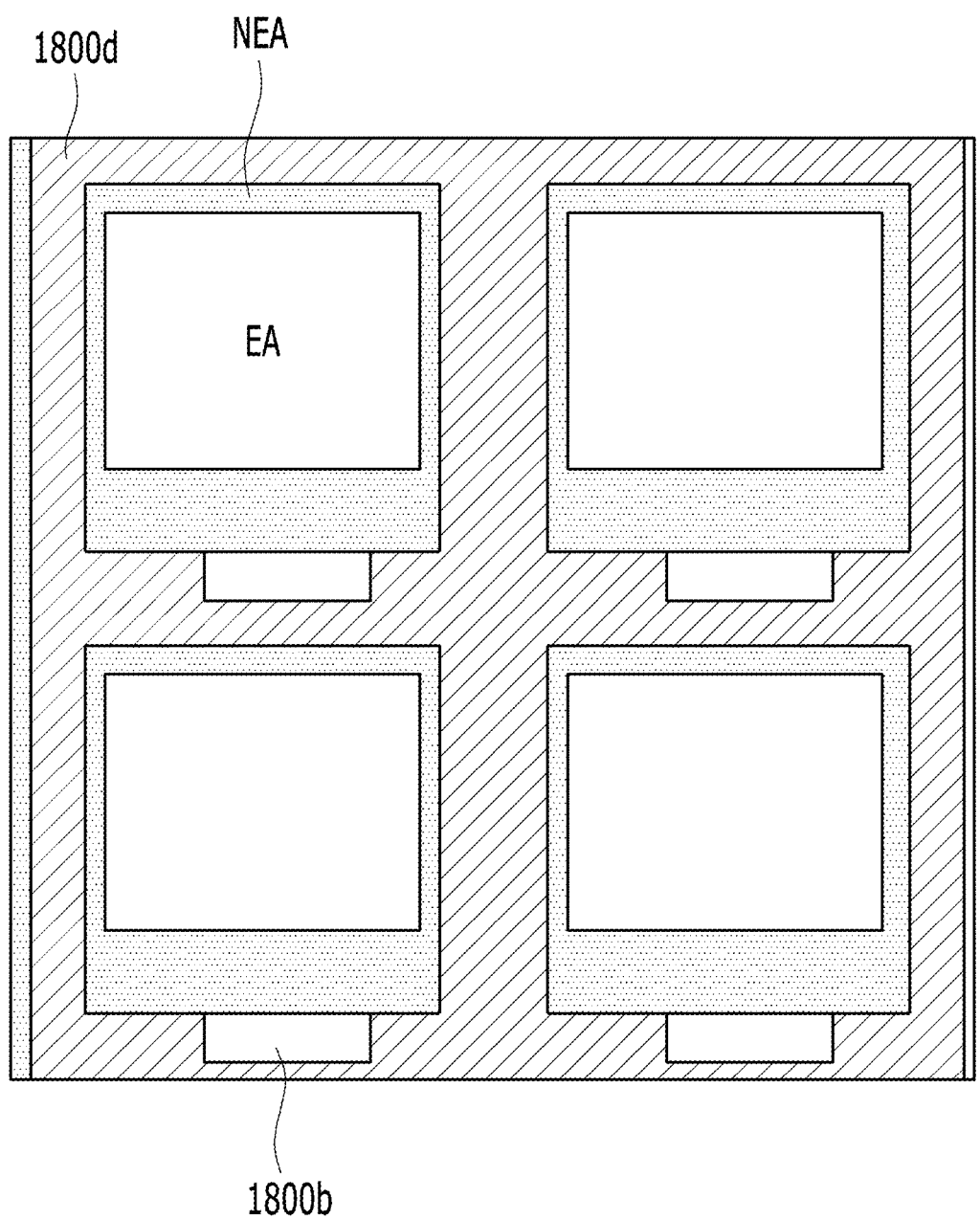
FIG. 18 is a plan view illustrating an organic light-emitting display device according to a sixth embodiment of the present invention.

FIG. 18 is a plan view illustrating an organic light-emitting display device according to a sixth embodiment of the present invention.

As illustrated in FIG. 18, the organic light-emitting display device according to the sixth embodiment of the present invention may include a second hole 1800d, which has been described in the fifth embodiment and the alternative embodiments thereof, in the non-emission area NEA, which surrounds the emission area EA, on a per sub-pixel basis. At this time, the second hole 1800d may have a closed loop shape, and may be located so as to communicate with the above-described first hole 1800b.

In this case, in each sub-pixel, an organic light-emitting layer is separated by the second hole 1800d, which has a closed loop shape, which enables independent driving of sub-pixels.

In addition, the second hole 1800d in the interlayer insulation stack 1800 has an undercut structure defined therein by the vertical space between the bank 150, the overcoat layer 208, or the anode dummy pattern 220, which protrudes into one side of the second hole 1800d, and the interlayer insulation film 104 thereunder. The protruding pattern inside the second hole 1800d may realize separation of the organic light-emitting layer between sub-pixels.

Meanwhile, the organic light-emitting display device of the present invention, described above, includes a structure for connection between a cathode and an auxiliary electrode in order to reduce the resistance of the cathode, and an undercut structure for separation of an organic light-emitting layer between sub-pixels in order to prevent current leakage. Because an interlayer insulation film, a bank, or an anode material provided in the device forms the undercut structure without a partition wall, the number of masks may be reduced, and any process or material for forming the partition wall may be omitted, which may result in an increase in the yield rate and in the reliability of the organic light-emitting display device.

As is apparent from the above description, an organic light-emitting display device and a method of manufacturing the same according to the present invention have the following effects.

In an interlayer insulation stack including a protective film (inorganic insulation film) and an insulation film or metal film, which is disposed on the protective film and has properties different from those of the protective film, at least one surface thereof forms an undercut structure. As such, a region in which no organic light-emitting layer is formed may be defined on an auxiliary electrode without providing a partition wall above the auxiliary electrode, and directly electrical connection between the auxiliary electrode and a cathode may be implemented in the region in which no organic light-emitting layer is formed. Accordingly, the resistance of the cathode, which is formed in a single pattern on a panel, may be reduced, and consequently, electrical reliability and uniform brightness over the entire panel may be realized.

In addition, an overcoat layer, a bank, or/and an anode material are disposed on the protective film, and at least one of them forms a protruding pattern inside a hole above the auxiliary electrode. And then the protective film below the protruding pattern is removed so as to define undercut structure after the above layers are formed. Therefore, remaining particle in the undercut structure can be removed and the reflow of the protruding pattern may be prevented.

In addition, because no partition wall is used, the number of masks is reduced, which may reduce the processing time and cost.

In addition, when the overcoat layer or anode material pattern on the protective film is located inside a contact hole above the auxiliary electrode, a partial region of the auxiliary electrode may be covered with the undercut structure, whereby selective deposition of the cathode is made possible via the region.

In conclusion, electrical connection between the auxiliary electrode and the cathode may be stabilized, which may reduce the resistance of the large-area cathode, resulting in uniform brightness over the entire panel.

In addition, when the undercut structure in the interlayer insulation stack described above is used for isolation of an organic light-emitting layer between sub-pixels, lateral current leakage due to the organic light-emitting layer or a common layer may be prevented.

The features, structures, effects, and the like of the described embodiments are included in at least one embodiment of the present invention, but should not be construed as being limited to only one embodiment. In addition, the features, structures, effects, and the like of the described embodiments may be combined or modified in other embodiments by those skilled in the art. Content related to these combinations and modifications should be construed as falling in the scope of the present invention.

It will be apparent to those skilled in the art that the present invention described above is not limited to the embodiments described above and the accompanying drawings, and various substitutions, modifications, and alterations may be devised within the spirit and scope of the present invention.

What is claimed is:

1. An organic light-emitting display device comprising:
    a substrate including a display area and an edge area surrounding the display area, wherein in the display area, sub-pixels are arranged in a matrix and include an emission area and a non-emission area around the emission area;
    a driving thin film transistor in each sub-pixel on the substrate, including at least an electrode;
    an auxiliary electrode in a non-emission area of the sub-pixel;
    an insulation stack having a first hole exposing the auxiliary electrode, the insulating stack including an inorganic insulation film and an organic insulation film disposed on the inorganic insulation film, a first width of the first hole at a level of the inorganic insulation film being less than a second width of the first hole at a level of the organic insulation film;
    an organic light-emitting diode (OLED) in the emission area, the organic light-emitting diode including an anode electrically connected to the driving thin film transistor, a cathode, and an organic light-emitting layer between the anode and the cathode; and
    a protruding layer on the insulation stack, the protruding layer being from an anode dummy pattern at least partially in the same layer as the anode and disposed on and in contact with a top surface and a side surface of the organic insulation film,
    wherein the protruding layer includes a first protruding pattern protruding into the first hole to overlap an upper surface of the auxiliary electrode with a first vertical gap between the first protruding pattern and the upper surface of the auxiliary electrode, and
    wherein the cathode contacts the upper surface of the auxiliary electrode and one end of the inorganic insulation film at least within the first vertical gap.

2. The organic light-emitting display device of claim 1, wherein the first vertical gap is formed by removing the inorganic insulation film on the upper surface of the auxiliary electrode.

3. The organic light-emitting display device of claim 1, wherein the auxiliary electrode is located in the same layer as a source electrode or a drain electrode of the driving thin-film transistor.

4. The organic light-emitting display device of claim 1, wherein the first protruding pattern has a flat shape in the first hole substantially parallel to the upper surface of the auxiliary electrode.

5. The organic light-emitting display device of claim 4, wherein the organic light-emitting layer is disposed on the upper surface of the auxiliary electrode at a region that does not overlap the first protruding pattern and the cathode directly contacts the upper surface of the auxiliary electrode under the first protruding pattern in the first hole.

6. The organic light-emitting display device of claim 1, further comprising an interlayer insulation film under the inorganic insulation film,
    wherein flattened portions of a source electrode and a drain electrode of the driving thin film transistor are on an upper surface of the interlayer insulation film, and
    an active layer and a gate electrode of the driving thin film transistor are covered by the interlayer insulation film.

7. The organic light-emitting display device of claim 6, wherein the auxiliary electrode is located in the same layer as the flattened portions of the source electrode and the drain electrode of the driving thin-film transistor.

8. The organic light-emitting display device of claim 1, wherein the auxiliary electrode is located in the same layer as a pad electrode in the edge area.

9. An organic light-emitting display device comprising:
    a substrate including a display area and an edge area surrounding the display area, wherein in the display area, sub-pixels are arranged in a matrix and include an emission area and a non-emission area around the emission area;
a driving thin film transistor in each sub-pixel on the substrate, including at least an electrode;
an auxiliary electrode in a non-emission area of the sub-pixel;
an insulation stack including an inorganic insulation film and an organic insulation film which are sequentially stacked, the insulation stack having a first hole exposing the auxiliary electrode;
an organic light-emitting diode (OLED) in the emission area, the organic light-emitting diode including an anode electrically connected to the driving thin film transistor, a cathode, and an organic light-emitting layer between the anode and the cathode;
a protruding layer on the insulation stack, the protruding layer being from an anode dummy pattern at least partially in the same layer as the anode; and
a bank having an opening in the emission area,
wherein the bank is provided on a lateral surface of the insulation stack at the non-emission area excluding the first hole,
wherein the protruding layer includes a first protruding pattern protruding into the first hole so as to overlap an upper surface of the auxiliary electrode with a first vertical gap between the first protruding pattern and the upper surface of the auxiliary electrode, and
wherein the cathode contacts the upper surface of the auxiliary electrode at least within the first vertical gap.

* * * * *